US011776828B2

(12) United States Patent
Sakaue

(10) Patent No.: US 11,776,828 B2
(45) Date of Patent: Oct. 3, 2023

(54) VACUUM PROCESSING DEVICE

(71) Applicant: TOKYO ELECTRON LIMITED, Tokyo (JP)

(72) Inventor: Hiromitsu Sakaue, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 73 days.

(21) Appl. No.: 16/612,322

(22) PCT Filed: Apr. 24, 2018

(86) PCT No.: PCT/JP2018/016659
§ 371 (c)(1),
(2) Date: Nov. 8, 2019

(87) PCT Pub. No.: WO2018/207616
PCT Pub. Date: Nov. 15, 2018

(65) Prior Publication Data
US 2021/0143035 A1 May 13, 2021

(30) Foreign Application Priority Data
May 11, 2017 (JP) .................. 2017-094939

(51) Int. Cl.
*H01L 21/67* (2006.01)
*H01L 21/677* (2006.01)
*H01L 21/687* (2006.01)

(52) U.S. Cl.
CPC .. *H01L 21/67201* (2013.01); *H01L 21/67167* (2013.01); *H01L 21/67196* (2013.01); *H01L 21/67742* (2013.01); *H01L 21/68785* (2013.01)

(58) Field of Classification Search
CPC .............................. H01L 21/67201
See application file for complete search history.

(56) References Cited

U.S. PATENT DOCUMENTS 6,428,262 B1 * 8/2002 Vanderpot ......... H01L 21/67754
414/217
7,949,425 B2 * 5/2011 Mitchell ........... H01L 21/67745
700/218

(Continued)

FOREIGN PATENT DOCUMENTS

JP  2009-094530 A  4/2009
JP  2009-117568 A  5/2009

(Continued)

OTHER PUBLICATIONS

PCT International Search Report and Written Opinion, PCT Application No. PCT/JP2018/016659, dated Jun. 5, 2018, 9 pages (with English translation of International Search Report).

*Primary Examiner* — Parviz Hassanzadeh
*Assistant Examiner* — Nathan K Ford
(74) *Attorney, Agent, or Firm* — Fenwick & West LLP

(57) ABSTRACT

In a vacuum processing device, a loading/unloading port, a normal pressure transfer chamber and a vacuum transfer chamber are arranged in that order from a front side toward a rear side, and load-lock chambers are connected to the normal pressure transfer chamber. The position in the front-rear direction in a movement range of a wafer W in the normal pressure transfer chamber overlaps with the positions in the front-rear direction of the load-lock chambers. Three vacuum processing modules are connected to each of the left and right sides of the vacuum transfer chamber. Vacuum processing units are arranged in each of the vacuum processing modules in a front-rear direction when viewed from the vacuum transfer chamber side. Wafer mounting shelves for holding wafers W in the load-lock chambers are arranged in the front-rear direction when viewed from the vacuum transfer chamber side.

7 Claims, 17 Drawing Sheets

(56) References Cited

U.S. PATENT DOCUMENTS

| | | | | |
|---|---|---|---|---|
| 2008/0138178 | A1* | 6/2008 | Ferrara | C23C 14/48 |
| | | | | 414/757 |
| 2012/0322015 | A1* | 12/2012 | Kim | H01L 21/67201 |
| | | | | 432/1 |
| 2017/0040204 | A1* | 2/2017 | Kim | H01L 21/67754 |

FOREIGN PATENT DOCUMENTS

| | | | |
|---|---|---|---|
| JP | 2013-171871 | A | 9/2013 |
| JP | 2015-508236 | A | 3/2015 |
| JP | 2015-154083 | A | 8/2015 |
| KR | 10-2008-0004118 | A | 1/2008 |
| TW | 200943469 | A | 10/2009 |
| TW | 201304039 | A | 1/2013 |
| TW | 201709392 | A | 3/2017 |

* cited by examiner

VACUUM PROCESSING DEVICE

TECHNICAL FIELD

The present invention relates to a vacuum processing device for processing a substrate under a vacuum atmosphere.

BACKGROUND

As an apparatus for performing vacuum processing which is one of the semiconductor device manufacturing processes, while ensuring a high throughput, there is known a vacuum processing device for processing a plurality of semiconductor wafers (hereinafter, referred to as "wafers") all at once in a processing chamber that forms a vacuum processing chamber. For example, Patent Document 1 discloses a device for generating a wafer processing atmosphere using sets of mounting tables arranged in a circumferential direction in a vacuum chamber and ceiling plates corresponding to the mounting tables. This device is configured to transfer a wafer from an atmospheric atmosphere or an atmosphere of a normal-pressure inert gas to a vacuum processing module via a load-lock chamber and a vacuum transfer chamber.

In this vacuum processing device, there is a demand for improvement of the throughput of the wafer. For example, it is being considered to increase the number of wafers to be processed in each vacuum processing module to increase the number of wafers that can be processed simultaneously by the vacuum processing device. However, if the number of wafers to be processed is increased, the device is scaled-up and the installation area of the vacuum processing device is increased.

Further, if the number of wafers that can be processed simultaneously by the vacuum processing device is increased, the wafer transfer time in the vacuum processing device is increased. Therefore, the number of wafers processed per unit time in the vacuum processing device is not increased as expected.

Patent Documents 1 and 2 disclose vacuum processing devices, each being connected to a vacuum processing module for processing a plurality of wafers. However, the vacuum processing devices disclosed in Patent Documents 1 and 2 are disadvantageous in that the area occupied by the devices with respect to the number of wafers to be processed is increased. In addition, along with an increase in the number of wafers to be processed, it is required to further improve a wafer transfer method in the vacuum processing device.

PRIOR ART

Patent Document 1: Japanese Patent Application Publication No. 2009-94530
Patent Document 2: Japanese Patent Application Publication No. 2015-154083

In view of the above, the present invention provides a technique for scaling down a vacuum processing device for processing a substrate under a vacuum atmosphere and for improving the throughput of a substrate.

SUMMARY

In accordance with an aspect of the present invention, there is provided a vacuum processing device in which a loading/unloading port is provided to load and unload a substrate transfer container therethrough, a normal pressure transfer chamber is provided to have therein a normal pressure transfer mechanism for transferring a substrate to and from the substrate transfer container mounted on the loading/unloading port under a normal pressure atmosphere, and a vacuum transfer chamber in a vacuum atmosphere is provided, and the loading/unloading port, the normal pressure transfer chamber and the vacuum transfer chamber are arranged in that order from a front side toward a rear side, the vacuum processing device including: a vacuum transfer mechanism disposed in the vacuum transfer chamber and having a holder configured to hold a substrate on each of a tip end and a base end thereof; a plurality of vacuum processing modules airtightly connected to each of a right side and a left side of the vacuum transfer chamber when viewed from the loading/unloading port, wherein the substrate held on the tip end and the substrate held on the base end of the holder are collectively loaded into each of the vacuum processing modules, and vacuum processing is performed on the substrates held by the holder; and load-lock chambers disposed on the right side and the left side when viewed from the loading/unloading port and having an inner atmosphere switched between a normal pressure atmosphere and a vacuum atmosphere, wherein the substrate held on the tip end and the substrate held on the base end of the holder are collectively loaded into and unloaded from each of the load-lock chambers, and a substrate is loaded into and unloaded from each of the load-lock chambers by the normal pressure transfer mechanism.

Further, a substrate transfer area outside each of the load-lock chambers in an area where the substrate is transferred by the normal pressure transfer mechanism overlaps with a substrate mounting position in the corresponding load-lock chamber in the front-rear direction of the vacuum processing device.

EFFECT OF THE INVENTION

In the vacuum processing device according to the aspect of the present invention, when the load-lock chambers are connected to the normal pressure transfer chamber connected to the rear side of the loading/unloading port, the substrate transfer area outside each of the load-lock chambers and the substrate mounting position in the corresponding load-lock chamber overlap with each other in the front-rear direction. Therefore, the length in the front-rear direction of the vacuum processing device can be shortened, and the installation area of the vacuum processing device can be reduced.

Further, the vacuum processing modules are arranged in the front-rear direction at each of the left and right sides of the vacuum transfer chamber. Each of the vacuum processing modules are configured to mount the substrates in a front-rear direction when viewed from a loading/unloading port of the corresponding vacuum processing module, and the vacuum transfer mechanism is configured to collectively transfer the substrates to the vacuum processing modules and the load-lock chambers. Accordingly, the throughput of the device can be improved.

DETAILED DESCRIPTION

Figure 1:
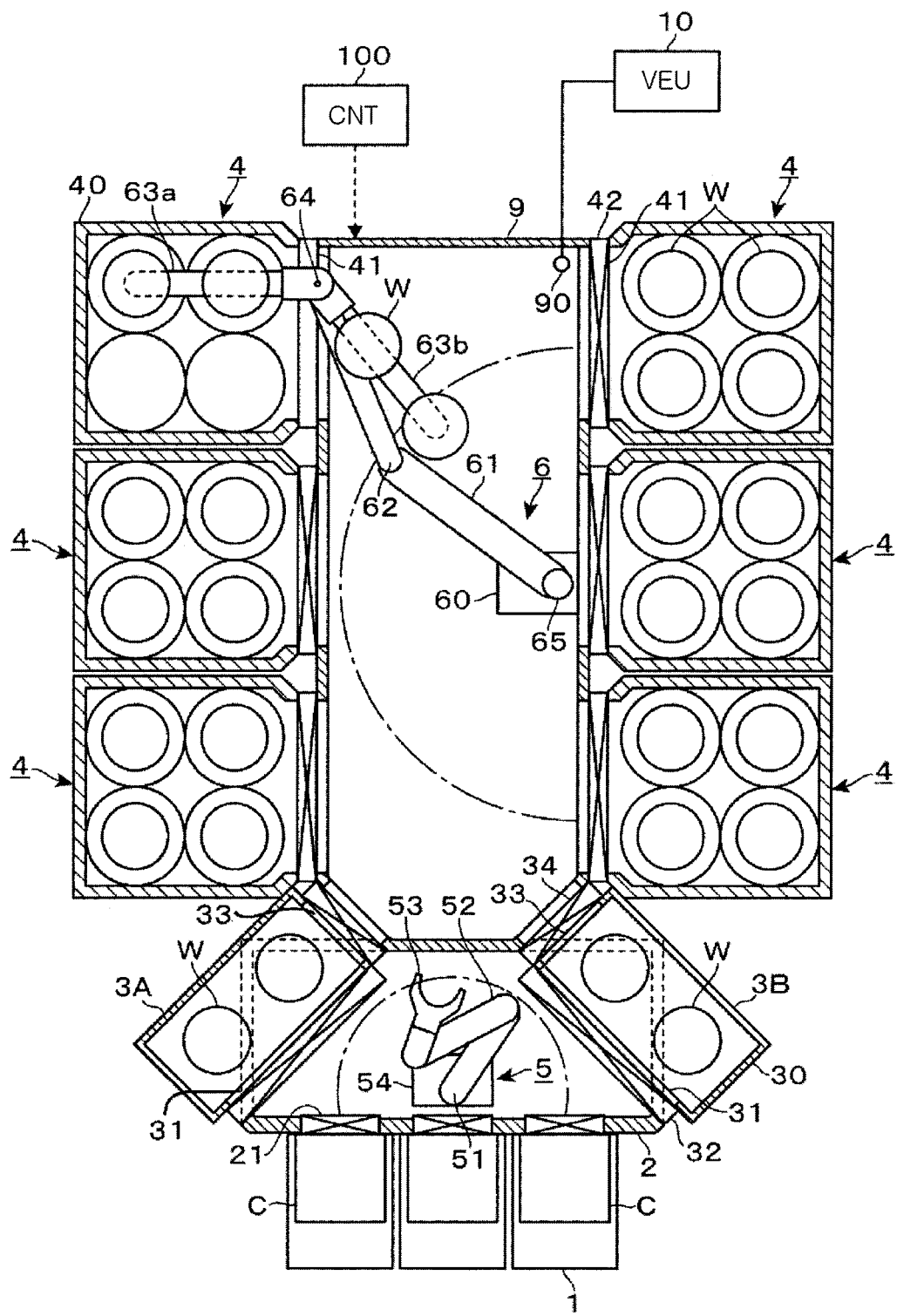
FIG. 1 is a plan view showing a vacuum processing device according to an embodiment of the present invention.
Figure 2:
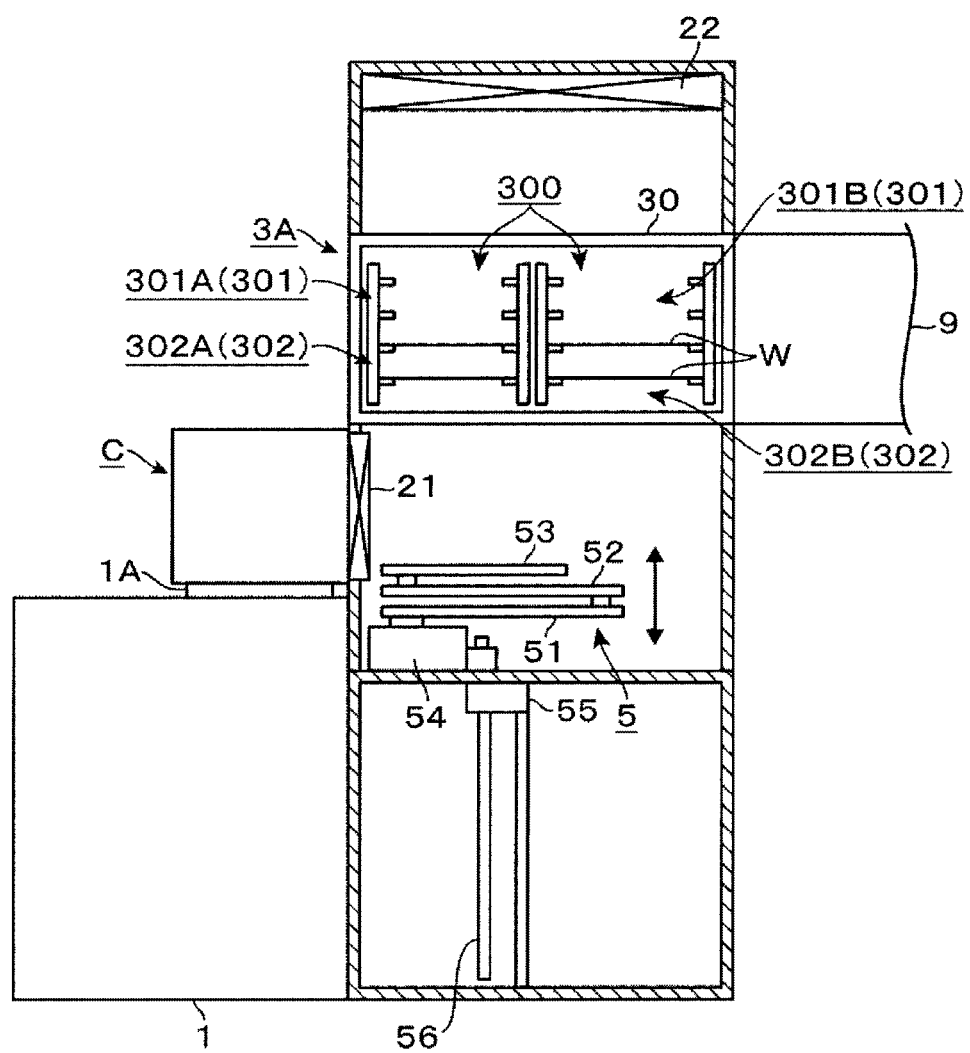
FIG. 2 is a longitudinal cross-sectional view showing a part of the vacuum processing device.

A vacuum processing device according to an embodiment of the present invention will be described. As shown in FIGS. 1 and 2, the vacuum processing device includes a rectangular normal pressure transfer chamber 2 having a normal pressure atmosphere of a dry gas, e.g., dry air or nitrogen gas (atmospheric atmosphere in the case of air). In the normal pressure transfer chamber 2, three loading/unloading ports 1, each including a stage 1A for mounting thereon a carrier C that is a transfer container of wafers W, are arranged side by side in a right-left direction. When the loading/unloading port 1 side is set to a front side and the normal pressure transfer chamber 2 side is set to a rear side, a door 21 that is opened and closed together with a lid of the carrier C is attached to a front wall of the normal pressure transfer chamber 2. In the normal pressure transfer chamber 2, a normal pressure transfer arm 5 that is a normal pressure transfer mechanism configured as an articulated arm for transferring the wafer W is provided.

As shown in FIGS. 1 and 2, the normal pressure transfer arm 5 has a case 54, and is configured as the articulated arm formed by connecting a lower arm 51, an upper arm 52, and a wafer holder 53 in that order to an upper surface of the case 54 through a rotation shaft (not shown). The entire articulated arm is configured to rotate or reciprocate by rotating a rotation shaft in the lower arm 51 or a main body of the lower arm 51 by using a rotation motor and a reciprocation motor (not shown) disposed in the case 54. Among the lower arm 51, the upper arm 52, and the wafer holder 53 of the normal pressure transfer arm 5, the lower arm 51 is the longest arm. The normal pressure transfer arm 5 can rotate in a range indicated by a dashed dotted line shown in FIG. 1 in the normal pressure transfer chamber 2 while holding the wafer W.

The case 54 has therein an elevating mechanism 55 disposed below the normal pressure transfer chamber 2 and configured to move the normal pressure transfer arm 5 along a guide rail 56 to height positions of load-lock chambers 3A and 3B to be described later. A fan filter unit 22 is disposed at a ceiling surface of the normal pressure transfer chamber 2 to form a downward air flow in the normal pressure transfer chamber 2.

As shown in FIG. 1, the load-lock chambers 3A and 3B including vacuum chambers 30 having a rectangular shape when viewed from above are disposed at a left side and a right side of the normal pressure transfer chamber 2, respectively, when viewed from the loading/unloading port 1. As shown in FIG. 2, the load-lock chambers 3A and 3B are located higher than a transfer surface where the wafer W is unloaded from the carrier C mounted on the loading/unloading port 1 by the normal pressure transfer arm 5.

The load-lock chamber 3A has therein wafer mounting shelves 300 to be described later. Each of the wafer mounting shelves 300 mounts thereon two wafers W so that the wafers W of the wafer mounting shelves 300 are mounted horizontally two by two. As will be described in detail later, each of the wafer mounting shelves 300 is configured to mount thereon two wafers W vertically spaced apart from each other, and two wafer mounting shelves 300 are connected vertically. The two sets of the two vertically connected wafer mounting shelves 300 are arranged horizontally when viewed from the normal pressure transfer chamber 2.

As shown in FIG. 1, the load-lock chamber 3A is arranged such that a line that connects the centers of the two wafers W horizontally mounted on each stage of the wafer mounting shelves 300 in the load-lock chamber 3A, i.e. an axis that connects the short sides of the vacuum chamber 30 when viewed from above in this example, forms an angle of, e.g., 45 degrees to the central axis in a right-left direction when viewing the vacuum transfer chamber 9 to be described later from the loading/unloading port 1. Here, the normal pressure transfer chamber 2 and the load-lock chamber 3A can be arranged such that the wafer transfer area of the normal pressure transfer arm 5 outside the load-lock chamber 3A and the wafer mounting position in the load-lock chambers 3A and 3B overlap with each other in the front-rear direction.

The load-lock chamber 3B is mirror-symmetrical with the load-lock chamber 3A with respect to the central axis in the left-right direction of the vacuum transfer chamber 9 when viewed from the loading/unloading port 1. Therefore, in the right load-lock chamber 3B as well, the axis that connects the centers of the short sides of the vacuum chamber 30 when viewed from above forms an angle of, e.g., 45 degrees to the central axis in the right-left direction when viewing the vacuum transfer chamber 9 to be described later from the loading/unloading port 1.

Figure 3:
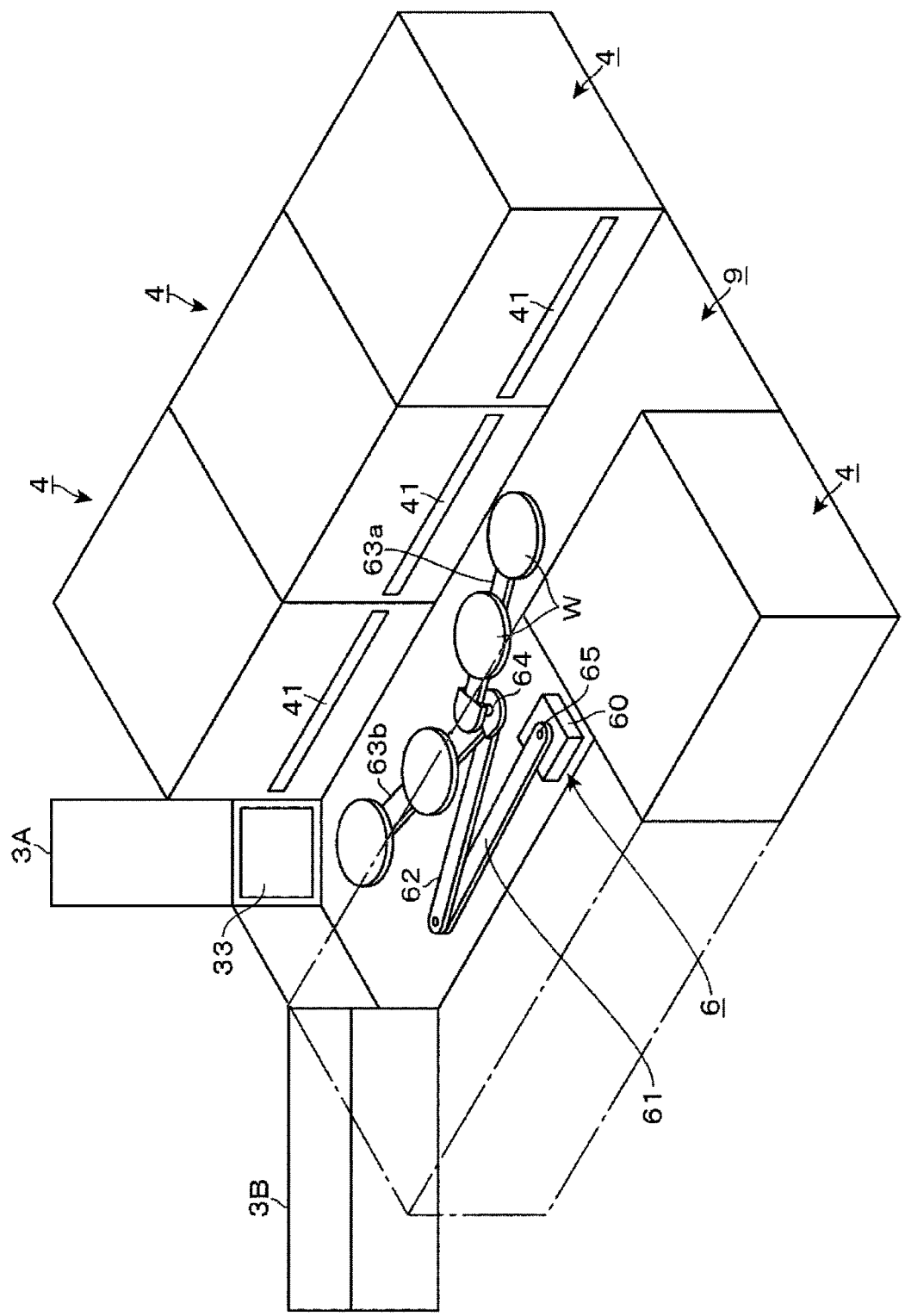
FIG. 3 is a perspective view showing a vacuum transfer chamber in the vacuum processing device.

Since the load-lock chambers 3A and 3B are mirror-symmetrical with each other, the left load-lock chamber 3A will be described representatively. As shown in FIG. 1, the load-lock chamber 3A includes the above-described rectangular vacuum chamber 30, and a transfer port 31 is formed at a side surface of the vacuum chamber 30 that faces the center of the normal pressure transfer chamber 2. The transfer port 31 is provided with a gate valve 32. As shown in FIGS. 1 and 3, a transfer port 33 for the wafer W is formed at a rear surface of each of the load-lock chambers 3A and 3B when viewed from the loading/unloading port 1, and is connected to a common vacuum transfer chamber 9 via a gate valve 34 for opening/closing the transfer port 33.

Figure 4:
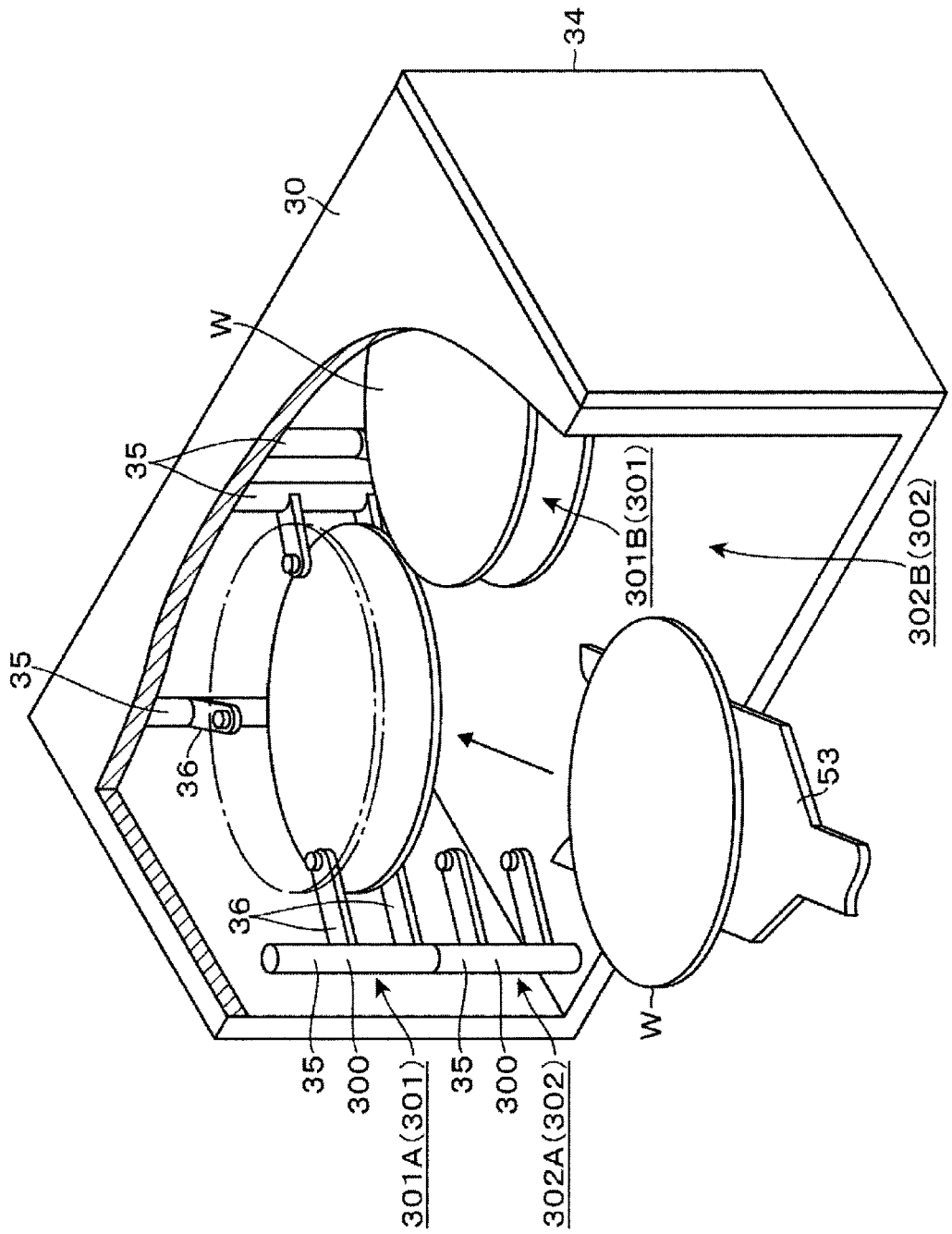
FIG. 4 is a perspective view showing a load-lock chamber.

As shown in FIGS. 2 and 4, the load-lock chamber 3A has therein four wafer mounting shelves 300 that are substrate mounting shelves, each for holding two wafers W as described above. In this example, the wafer mounting shelves 300 of the upper two rows serve as upper water mounting shelves 301 on which unprocessed wafers are mounted, and the wafer mounting shelves 300 of the lower two rows serve as lower wafer mounting shelves 302 on which processed wafers are mounted. In the following description, the upper wafer mounting shelf 301 and the lower wafer mounting shelf 302 on the rear side when viewed from the vacuum transfer chamber 9 are an upper wafer mounting shelf 301A and a lower wafer mounting shelf 302A, respectively, and the upper wafer mounting shelf 301 and the lower wafer mounting shelf 302 on the front side when viewed from the vacuum transfer chamber 9 are an upper wafer mounting shelf 301B and a lower wafer mounting shelf 392B, respectively.

Each wafer mounting shelf 300 has three support columns 35 and claws 36 having beams projecting from the support columns 35 at vertical intervals in the longitudinal direction of the support columns 35. The claws 36 support a peripheral portion of the wafer W to hold the wafer W horizontally. In the present embodiment, the support column 35 of the upper wafer mounting shelf 301A and the support column 35 of the lower wafer mounting shelf 302A vertically arranged on the rear side are connected to each other, and the support column 35 of the upper wafer mounting shelf 301(301B) and the lower wafer mounting shelf 302(302B) vertically arranged on the front side are connected to each other. The arrangement of the support columns 35 and the claws 36 will be described. Since the support columns 35 extend vertically in the load-lock chamber 3A, they are disposed at positions away from a path of the wafer W transferred from the normal pressure transfer chamber 2 and a path of the wafer W transferred by a vacuum transfer arm 6 to be described later.

Figure 5:
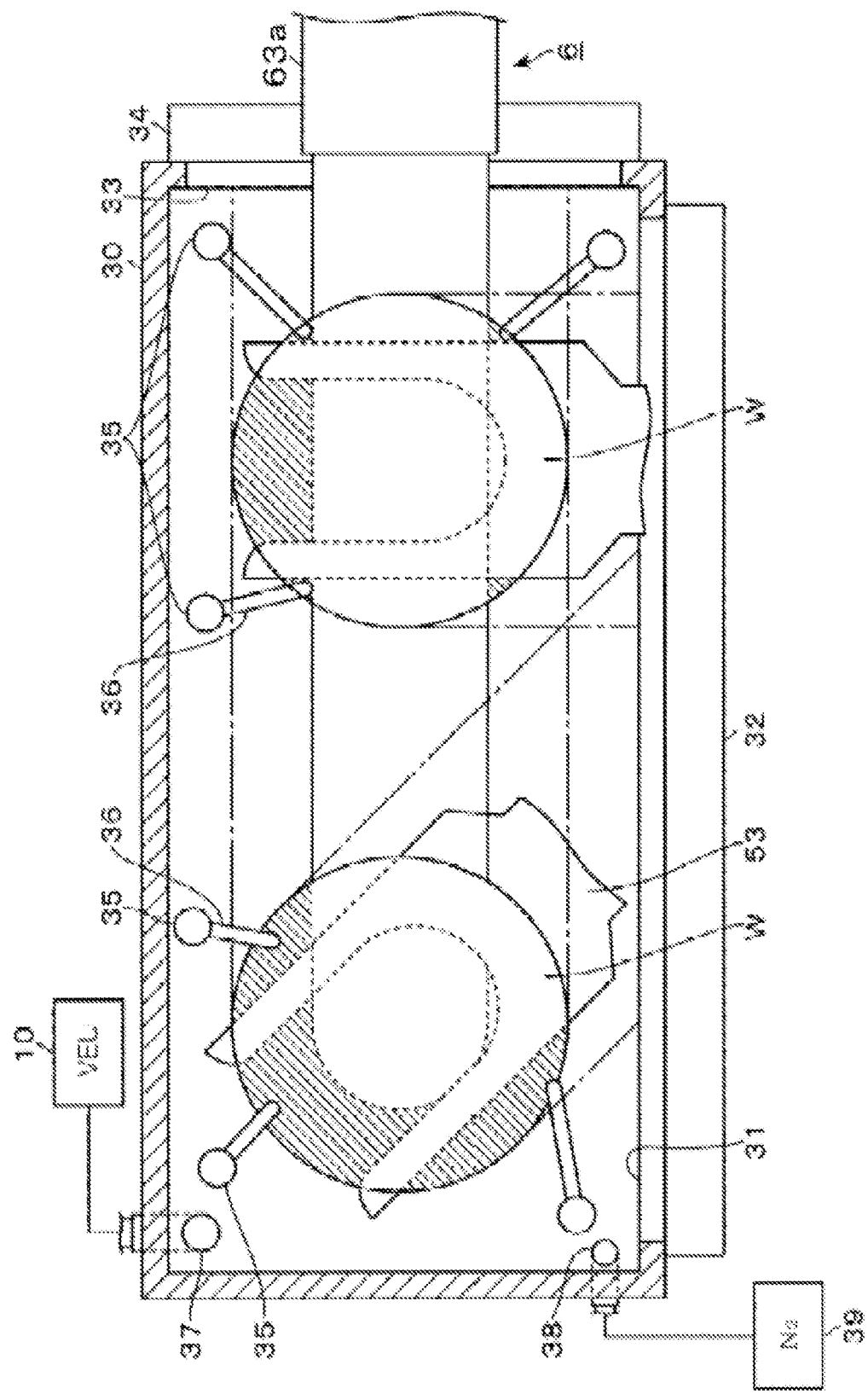
FIG. 5 is a plan view showing the load-lock chamber.

As shown in FIG. 5, in the load-lock chamber 3A, when the wafer W is transferred from the normal pressure transfer chamber 2 to the wafer mounting shelf 300 on the rear side when viewed from the vacuum transfer chamber 9, the wafer holder 53 of the normal pressure transfer arm 5 holding the wafer W enters the transfer port 31 while being inclined at an angle of, e.g., 45 degrees. When the wafer W is transferred from the normal pressure transfer chamber 2 to the wafer mounting shelf 300 on the front side when viewed from the vacuum transfer chamber 9, the wafer holder 53 of the normal pressure transfer arm 5 holding the wafer W enters at, e.g., a right angle to the surface where the transfer port 31 is formed. Further, a wafer holder 63a of the vacuum transfer arm 6 holding the wafer W enters perpendicularly to the surface where the transfer port 33 is formed.

Therefore, the support columns 35 are positioned away from the movement area of the wafer W in the load-lock chamber 3A, indicated by a dashed dotted line in FIG. 5. The beams of the claws 36 project to hold the peripheral portions of the wafers W without interfering with the wafer holder 53 of the normal pressure transfer arm 5 and the wafer holder 63a of the vacuum transfer arm 6 that are positioned to hold the wafers W at holding positions of the wafers W. Hatched areas in FIG. 5 indicate areas of the wafers W at the holding positions that do not overlap with the wafer holder 53 of the normal pressure transfer arm 5 and the wafer holder 63a of the vacuum transfer arm 6. It is preferable that the beams of the claws 36 project toward those areas.

The vertical intervals of the claws 36 are the same in all of the upper wafer mounting shelf 301A, the lower wafer mounting shelf 302A, the upper wafer mounting shelf 301B, and the lower wafer mounting shelf 302B. Each of the upper wafer mounting shelf 301A, the lower wafer mounting shelf 302A, the upper wafer mounting shelf 301B, and the lower wafer mounting shelf 302B holds two wafers W spaced apart from each other at the same vertical interval.

As shown in FIG. 5, a gas exhaust port 37 is disposed at a bottom surface of the load-lock chamber 3A to evacuate the load-lock chamber 3A to a vacuum atmosphere. The gas exhaust port 37 is connected to a vacuum exhaust unit (VEU) 10. In addition, a gas supply port 38 is disposed at the bottom surface of the load-lock chamber 3A to supply an inert gas such as nitrogen ($N_2$) gas into the load-lock chamber 3A and set an inner atmosphere to an atmospheric atmosphere (normal pressure atmosphere). The gas supply port 38 is connected to an $N_2$ gas supply source 39.

Referring back to FIGS. 1 and 3, the vacuum transfer chamber 9 has a substantially rectangular shape extending in the front-rear direction, and a gas exhaust port 90 is formed at a bottom surface thereof to set an inner atmosphere to a vacuum atmosphere. The gas exhaust port 90 is connected to the vacuum exhaust unit 10. Three vacuum processing modules 4, arranged at the front side, the middle side, and the rear side in the front-rear direction, are provided at both sides of the vacuum transfer chamber 9 when viewed from the loading/unloading port 1.

As shown in FIGS. 1 and 3, the vacuum transfer arm 6 that is a vacuum transfer mechanism is positioned away from the center of the vacuum transfer chamber 9. In other words, the vacuum transfer arm 6 is disposed in front of the right sidewall from the center of the vacuum transfer chamber 9 when viewed from the loading/unloading port 1.

The vacuum transfer arm 6 includes a lower arm 61 connected to a base 60 via a rotation shaft 65, and an upper arm 62 connected to a tip end of the lower arm 61. A rotation shaft 64 extending upward is provided at a tip end of the upper arm 62, and two spatula-shaped wafer holders 63a and 63b serving as holding bodies are connected to the rotation shaft 64.

Base end portions of the wafer holders 63a and 63b are connected to the rotation shaft 64 with a vertical interval in the height direction. Here, the vertical interval between the heights of the upper surfaces of the wafer holders 63a and 63b is equal to the vertical interval between the heights of the upper surfaces of the two wafers W held on the upper and the lower wafer mounting shelves 301 and 302 of the load-lock chambers 3A and 3B.

Further, the upper wafer holder 63a is set to a first wafer holder 63a and the lower wafer holder 63b is set to a second wafer holder 63b. The first and the second wafer holders 63a and 63b have substantially the same configuration and are configured to rotate independently about the rotation shaft 64. Each of the first and the second wafer holders 63a and 63b are configured to hold one wafer W on the tip end side and one wafer on the base end side. The position of the wafer W held on the tip end side and the position of the wafer W held on the base end side in each of the first and second wafer holders 63a and 63b are set to align the arrangement interval between the wafers W on the two wafer mounting shelves 300 arranged in the front-rear direction of the load-lock chamber 3A. Further, the position of the wafer W held on the tip end side and the position of the wafer W held on the base end side are set to correspond to the interval between mounting tables 11A and 11B arranged in the front-rear direction in the vacuum processing module 4 to be described later when viewed from the vacuum transfer chamber 9.

In the vacuum transfer arm 6, the lower arm 61 and the upper arm 62 are longer than two wafer holders 63a and 63b and can rotate within an area indicated by a dashed dotted line in the vacuum transfer chamber 9 shown in FIG. 1 while holding the wafers W. An elevating mechanism (not shown) is disposed in the base 60, and the height positions of the first and the second wafer holders 63a and 63b are integrally adjusted.

Figure 6:
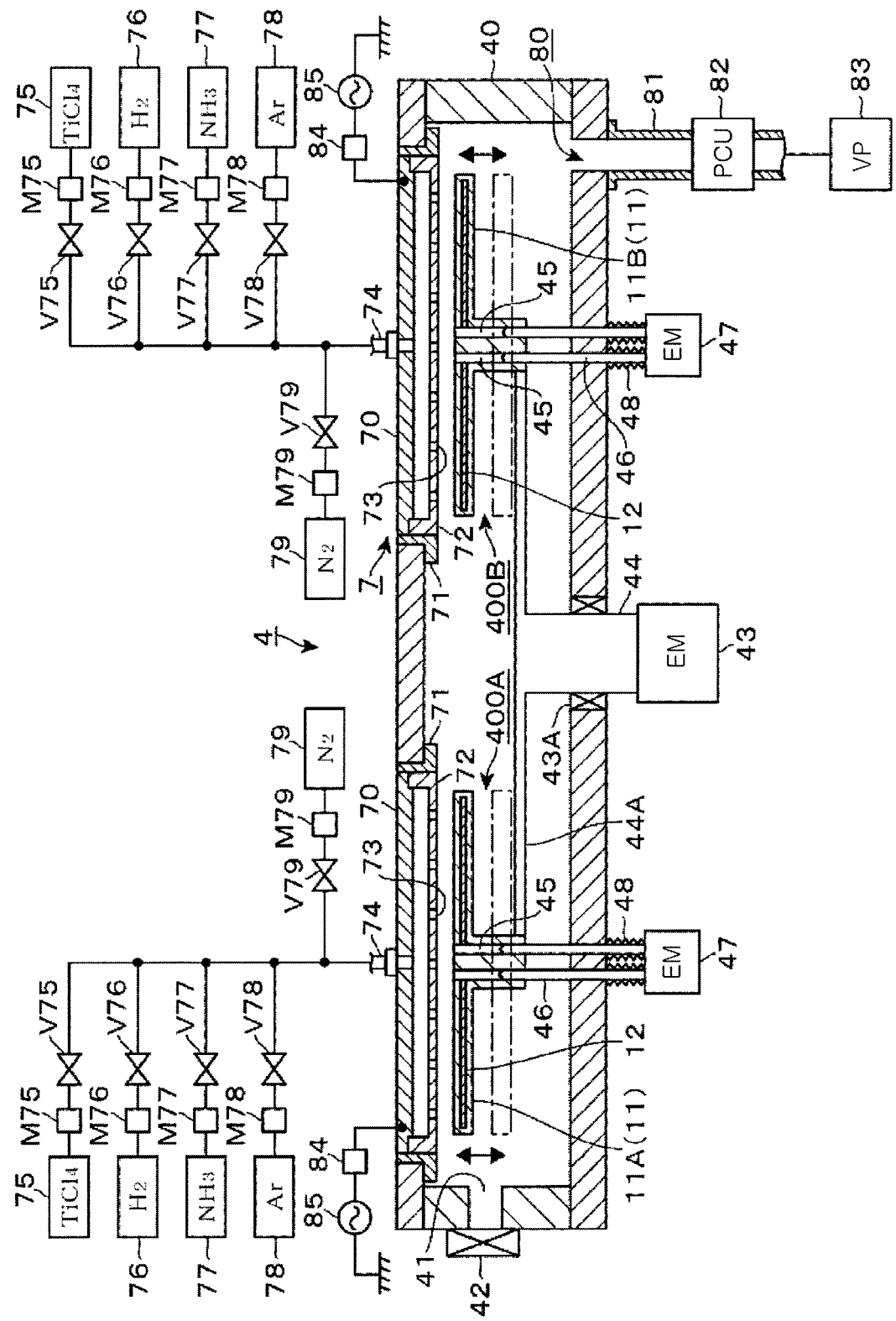
FIG. 6 is a cross-sectional view showing a vacuum processing module.

Hereinafter, the vacuum processing module 4 will be described. A film forming apparatus for forming a film on the wafer W by a plasma atomic layer deposition (ALD) will be described as an example of the vacuum processing module 4. For example, as shown in FIGS. 1 and 6, the vacuum processing module 4 includes a vacuum chamber 40 having a rectangular cross section, and a loading/unloading port 41 for loading and unloading the wafer W into and from the vacuum transfer chamber 9 is formed at a sidewall of the vacuum chamber 40 that faces the vacuum transfer chamber 9. The loading/unloading port 41 is opened and closed by a gate valve 42. In the vacuum chamber 40, vacuum processing units 400A and 400B arranged in the front-rear direction when viewed from the loading/unloading port 41 are arranged side by side in the left-right direction when viewed from the loading/unloading port 41. As shown in FIG. 6, a gas exhaust port 80 for exhausting the atmosphere in the vacuum chamber 40 is disposed at the bottom surface of the vacuum chamber 40. A gas exhaust line 81 is connected to the gas exhaust port 80 and also connected to a vacuum pump (VP) 83 constituting a vacuum exhaust unit via a pressure control unit (PCU) 82 for controlling a pressure in the vacuum chamber 40.

As shown in FIG. 6, the vacuum processing units 400A and 400B include the mounting tables 11A and 11B for mounting thereon the wafers W, respectively. Each of the mounting tables 11A and 11B is formed in a cylindrical shape having a flat upper surface and is made of, e.g., aluminum or nickel. Each of the mounting tables 11A and 11B has therein a heater 12 constituting a heating unit made of, e.g., a sheet-shaped resistance heating element for heating the wafer W on the mounting surface. The heater 12 is configured to heat the wafer W to be in a range from about 300° C. to 450° C. Further, each of the mounting tables 11A and 11B is connected to the ground potential via a matching unit (not shown).

The mounting tables 11A and 11B of the vacuum processing units 400A and 400B are supported at the lower part thereof by a support arm 44A. The base end of the support arm 44A is connected to a top portion of a support column 44. The support column 44 extends through the bottom surface of the vacuum chamber 40, and an elevating mechanism (EM) 43 is connected to the lower end of the support column 44. In FIG. 6, a reference numeral '43A' indicates a sealing member for airtightly sealing the vacuum chamber 40. The elevating mechanism 43 raises and lowers the support column 44 and the support arm 44A and moves the mounting tables 11A and 11B up and down simultaneously. The mounting tables 11A and 11B are moved up and down between a processing position indicated by a solid line in FIG. 6 where a film formation is performed and an exchange position indicated by a dashed dotted line in FIG. 6 where the wafers W are exchanged.

A gas shower head 7 that is a gas supply unit made of a metal and serving as an upper electrode is disposed at an upper portion of each of the vacuum processing units 400A and 400B via an insulating member 71. A high frequency power supply 85 is connected to the gas shower head 7 via a matching unit 84. A parallel plate type plasma processing apparatus can be configured by generating plasma by supplying a gas to be excited from the gas shower head 7 into the vacuum chamber 40 and applying a high frequency power to a gap between the gas shower head 7 serving as the upper electrode and the mounting tables 11A and 11B serving as the lower electrodes.

The gas shower head 7 that is the gas supply unit includes a shower plate 72 in which gas supply holes 73, arranged vertically and horizontally, extend therethrough in a thickness direction. Therefore, the gas can be supplied in a shower-like manner toward the mounting tables 11A and 11B. A heating mechanism (not shown) is embedded in the gas shower head 7 to heat the gas shower head 7 to a preset temperature.

The gas shower head 7 is connected to a downstream end of a gas supply line 74 extending through a ceiling member 70. An upstream side of the gas supply line 74 is branched and connected to a titanium tetrachloride ($TiCl_4$) gas supply source 75, a hydrogen ($H_2$) gas supply source 76, an ammonia ($NH_3$) gas supply source 77, an argon (Ar) gas supply source 78, and an $N_2$ gas supply source 79. In FIG. 2, reference symbols V75 to V79 indicate valves, and reference symbols M75 to M79 indicate flow rate controllers.

Figure 7:
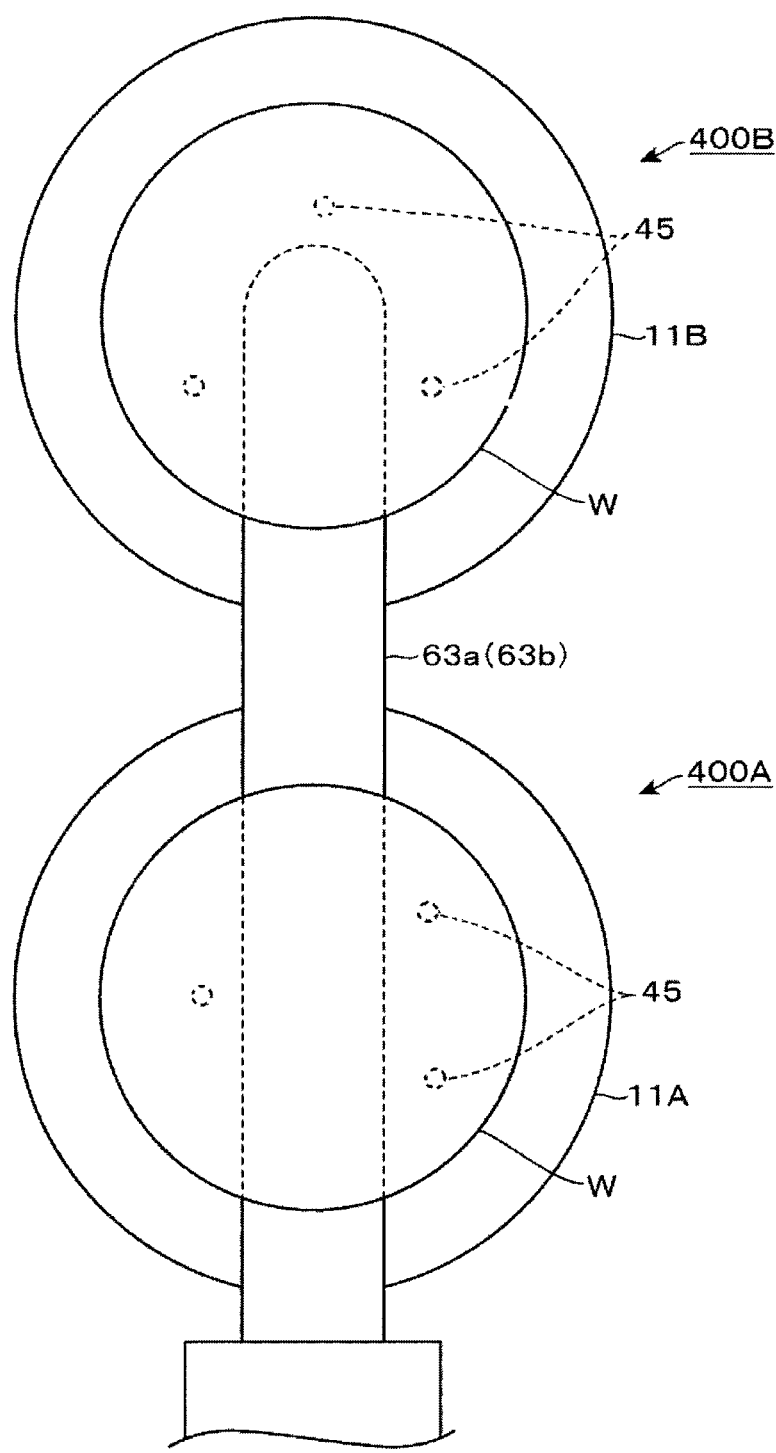
FIG. 7 shows a diagram explaining a wafer transfer in the vacuum processing module.

Three through-holes 45 are formed in each of the mounting tables 11A and 11B. FIG. 7 shows a state in which the wafer holders 63a and 63b of the vacuum transfer arm 6 are positioned above the mounting tables 11A and 11B. In the mounting table 11A of the vacuum processing unit 400A on the front side when viewed from the loading/unloading port 41, three through-holes 45 are formed to be positioned away from the wafer holders 63a and 63b that traverse the mounting table 11A. In the mounting table 11B of the vacuum processing unit 400B on the rear side when viewed from the loading/unloading port 41, the through-holes 45 are formed to be positioned away from the positions below the tip ends of the wafer holders 63a and 63b.

As shown in FIG. 6, lifting pins 46 for horizontally holding and lifting the wafers W on the mounting tables 11A and 11B are inserted into the through-holes 45. The lifting pins 46 are connected to an elevating mechanism (EM) 47 provided outside the vacuum chamber 40. The elevating mechanism 47 is, e.g., an air cylinder. In FIG. 6, a reference numeral '48' indicates a bellows for maintaining the inside of the vacuum chamber 40 in an airtight state. The wafers W are mounted on the mounting tables 11A and 11B by the cooperative operation of the lifting pins 46 and the vacuum transfer arm 6 in the vacuum transfer chamber 9.

The process of forming a film on the wafer W will be described briefly. After the wafers W are mounted on the four mounting tables 11A and 11B in the vacuum processing module 4, the mounting tables 11A and 11B are raised to the processing positions. Next, $TiCl_4$ gas, Ar gas, and $H_2$ gas are supplied as film forming gases into the vacuum chamber 40. Thereafter, the high frequency power supply 85 is switched on to apply a high frequency power to the gap between the gas shower head 7 and the mounting tables 11A and 11B, thereby generating plasma in the vacuum chamber 40. As a result, the $TiCl_4$ gas and the $H_2$ gas are activated and react with each other, thereby forming a Ti film on the surface of the wafer W.

Then, the supply of the $TiCl_4$ gas, the Ar gas and the $H_2$ gas, and the high frequency power are stopped, and the vacuum chamber 40 is exhausted to discharge the $TiCl_4$ gas, the Ar gas and the $H_2$ gas from the vacuum chamber 40. Next, $NH_3$ gas, Ar gas, and $H_2$ gas are supplied into the vacuum chamber 40 to nitride the surface of the Ti film. By supplying $NH_3$ gas, the Ti film is nitrided and chemical reaction proceeds. As a consequence, a titanium nitride (TiN) layer is formed on the surface of the Ti film. Then, the supply of the film forming gas and the supply of the nitriding gas are alternately repeated to repeat the Ti film formation on the surface of the wafer W and the nitriding of the Ti film. As a result, TiN layers are laminated.

As shown in FIG. 1, the vacuum processing device includes a controller (CNT) 100 for controlling the transfer of the wafer W in the vacuum processing device, the film formation in the vacuum processing module 4, and the switching of the atmosphere in the load-lock chambers 3A and 3B. The controller 100 is, e.g., a computer having a CPU and a storage unit (both not shown). The storage unit stores therein a recipe for film formation in the vacuum processing module 4 and/or a program having a group of steps (commands) for transferring the wafer W using the normal pressure transfer arm 5 and the vacuum transfer arm 6 in the vacuum processing device. This program is stored in a storage medium such as a hard disk, a compact disk, a magnetic optical disk, or a memory card, and is installed in the computer therefrom.

Next, the operation of the above-described embodiment will be described. Hereinafter, the unprocessed wafer W will be referred to as "unprocessed wafer W0"; the wafer W processed in the vacuum processing unit 400A on the front side when viewed from the vacuum transfer chamber 9 will be referred to as "processed wafer WA"; and the wafer W processed in the vacuum processing unit 400B on the rear side when viewed from the vacuum transfer chamber 9 will be referred to as "processed wafer WB." The processed wafers WA and WB are shown with hatched lines.

Figure 8:
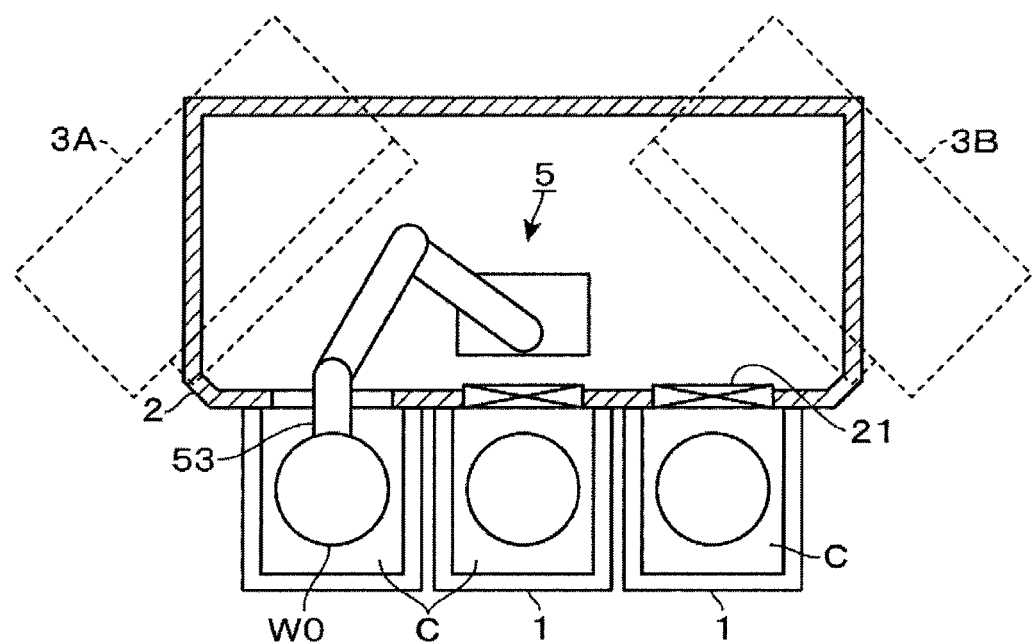
FIGS. 8 to 10 show diagrams explaining the operations of the embodiment of the present invention.
Figure 9:
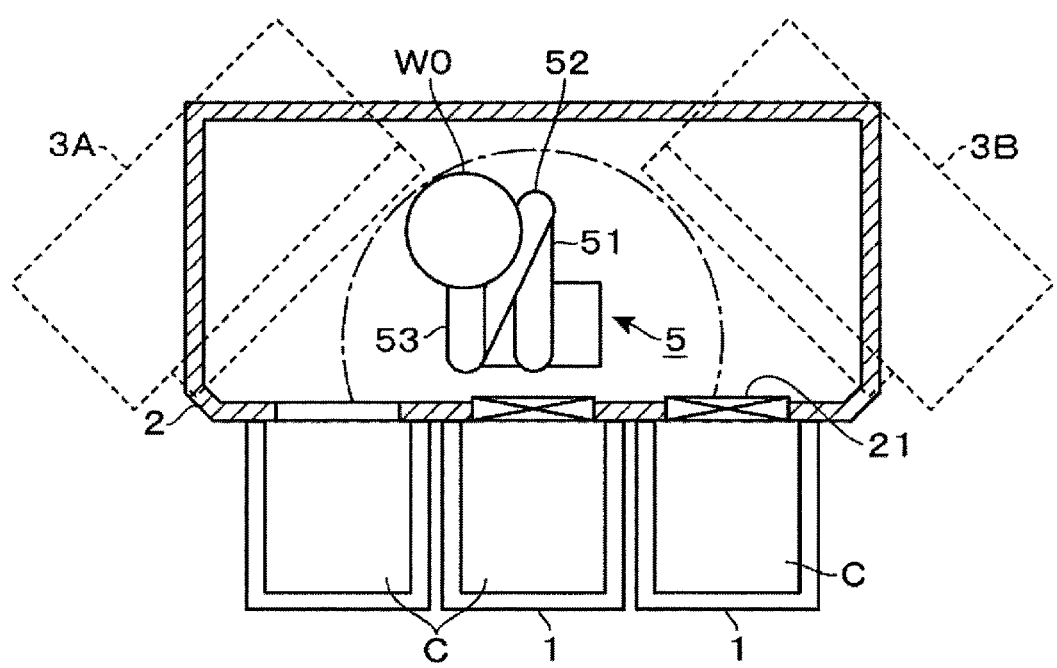

As shown in FIG. 8, when the carrier C accommodating the unprocessed wafers W0 is mounted on the loading/unloading port 1, one unprocessed wafer W0 in the carrier C is taken out by the normal pressure transfer arm 5. As shown in FIG. 9, the normal pressure transfer arm 5 folds the wafer holder 53 to avoid interference with the load-lock chambers 3A and 3B, and raises the unprocessed wafer W0 to a height for holding the unprocessed wafer W0 in the wafer mounting shelf 300 in the load-lock chamber 3A, e.g., to a height for delivering the unprocessed wafer W0 to and from the upper claws 36 of the upper wafer mounting shelves 301A and 301B.

Next, the gate valve 32 of the load-lock chamber 3A on the left side when viewed from the loading/unloading port 1 that faces the normal pressure transfer chamber 2 is opened. Further, the normal pressure transfer arm 5 mounts the unprocessed wafer W0 on the upper stage of the upper wafer mounting shelf 301A in the load-lock chamber 3A on the rear side when viewed from the vacuum transfer chamber 9. In this manner, the normal pressure transfer arm 5 sequentially takes out the unprocessed wafers W0 from the carrier C, and transfers two unprocessed wafers W0 to the two upper wafer mounting shelves 301A and 301B in the load-lock chamber 3A on the left side when viewed from the loading/unloading port 1. Then, the gate valve 32 is closed and the atmosphere in the load-lock chamber 3A is switched from the atmospheric atmosphere to the vacuum atmosphere.

Next, in the load-lock chamber 3B on the right side when viewed from the loading/unloading port 1, as in the left load-lock chamber 3A, the normal pressure transfer arm 5 sequentially transfers two unprocessed wafers W0 to the upper wafer mounting shelves 301A and 301B. Further, the gate valve 32 is closed to switch the atmosphere in the load-lock chamber 3B from the atmospheric atmosphere to the vacuum atmosphere.

Figure 10:
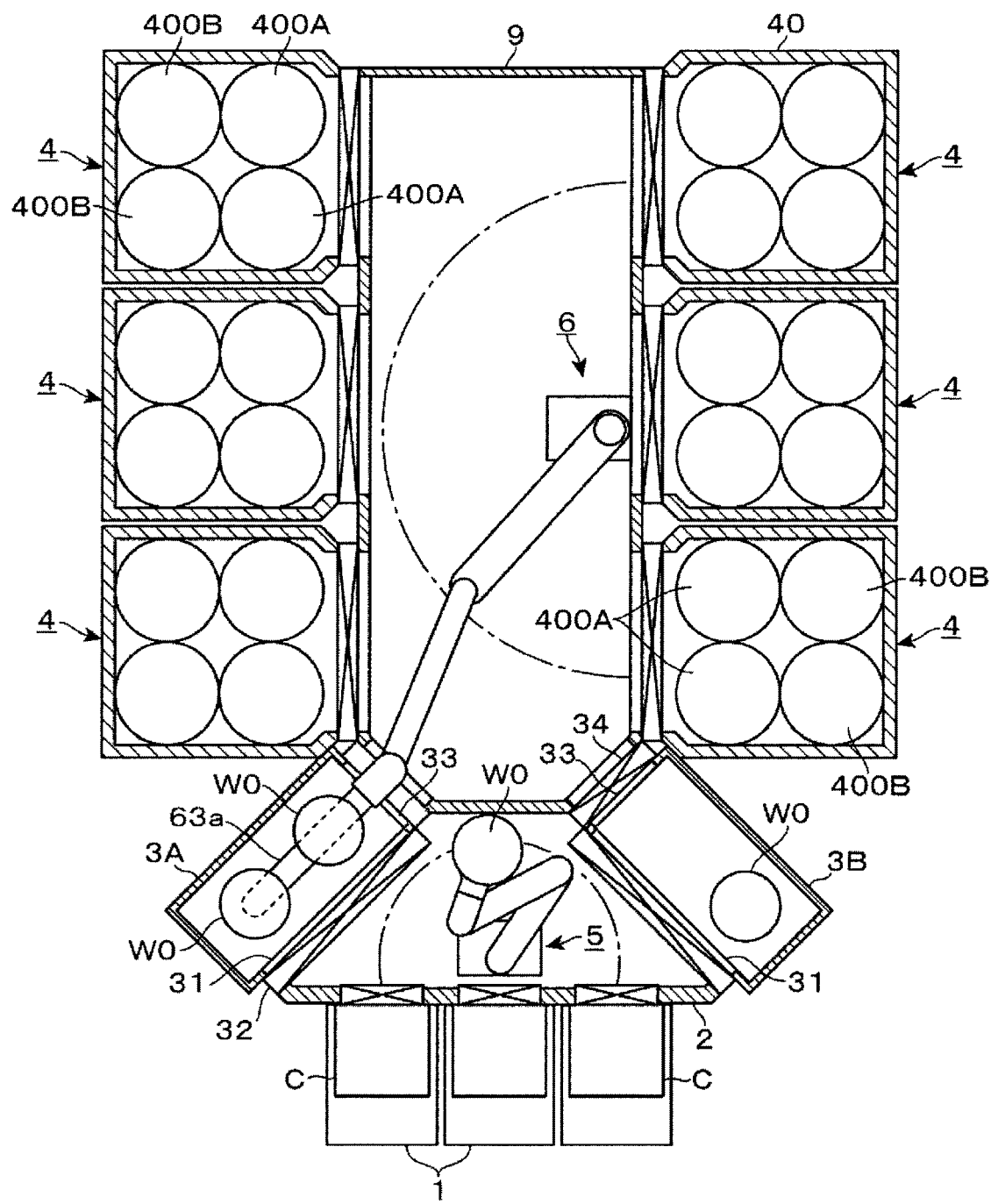

Next, as shown in FIG. 10, for example, the gate valve 34 of the left load-lock chamber 3A that faces the vacuum transfer chamber 9 is opened, and the directions of the first wafer holder 63a and the second wafer holder 63b in the vacuum transfer arm 6 are aligned to overlap with each other when viewed from above. The first wafer holder 63a and the second wafer holder 63b enter the left load-lock chamber 3A while being aligned with positions corresponding to the height position of the upper wafer mounting shelf 301A.

Figure 11:
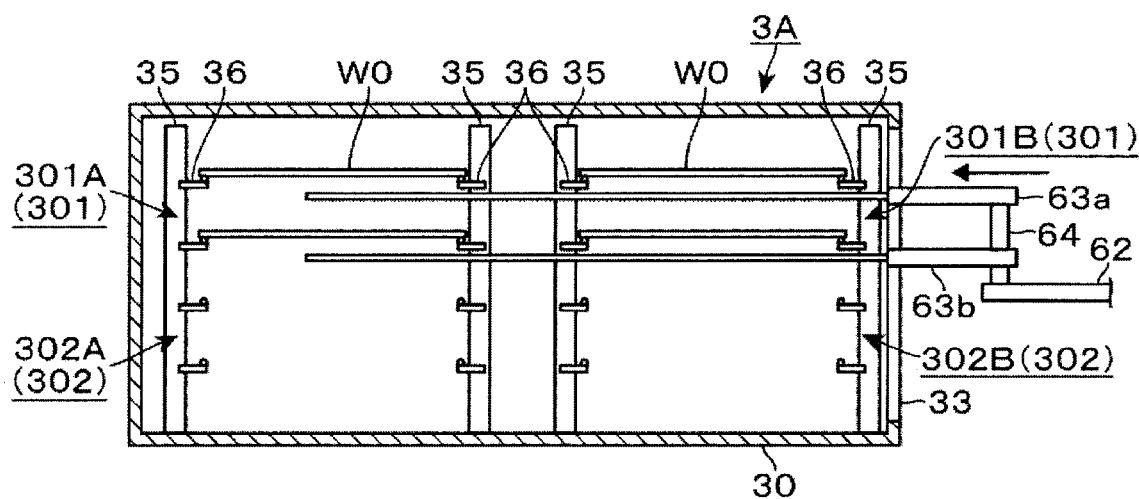
FIGS. 11 and 12 show diagrams explaining a wafer transfer in the load-lock chamber.
Figure 12:
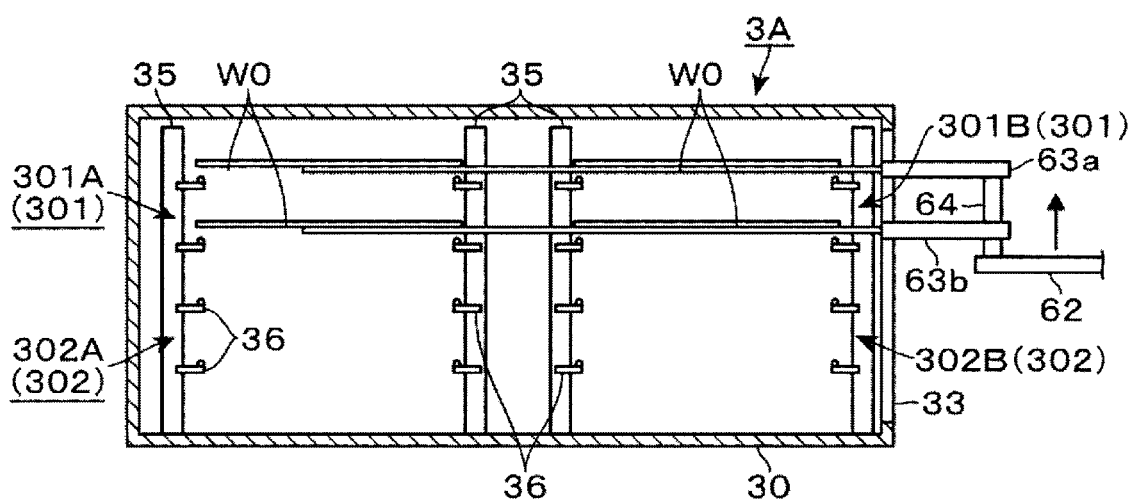

At this time, as shown in FIG. 11, the first wafer holder 63a is moved to a position below the unprocessed wafers W0 on the upper stages of the upper wafer mounting shelves 301A and 301B, and the second wafer holder 63b is moved to a position below the unprocessed wafers W0 on the lower stage of the upper wafer mounting shelves 301A and 301B. Then, as shown in FIG. 12, the first wafer holder 63a is raised to lift and hold the two unprocessed wafers W0 on the upper stages of the upper wafer mounting shelves 301A and 301B simultaneously, and the second wafer holder 63b is raised to lift and hold the two unprocessed wafers W0 on the lower stages of the upper wafer mounting shelves 301A and 301B simultaneously. Next, the vacuum transfer arm 6 holding the four unprocessed wafers W0 is retreated to the vacuum transfer chamber 9, and the gate valve 34 is closed. Accordingly, the four unprocessed wafers W0 in the load-lock chamber 3A are simultaneously lifted and unloaded by the vacuum transfer arm 6.

After the unprocessed wafers W0 are unloaded from the load-lock chamber 3A, the gate valve 34 is closed to switch the atmosphere in the load-lock chamber 3A to the atmospheric atmosphere. Further, the gate valve 32 on the normal pressure transfer chamber 2 side is opened, and new unprocessed wafers W0 sequentially are taken out from the carrier C by the normal pressure transfer arm 5. Then, the unprocessed wafers W0 are mounted on two stages of each of the upper wafer mounting shelves 301A and 301B. Thereafter, the gate valve 32 is closed, and the atmosphere in the load-lock chamber 3A is maintained in a vacuum atmosphere.

Figure 13:
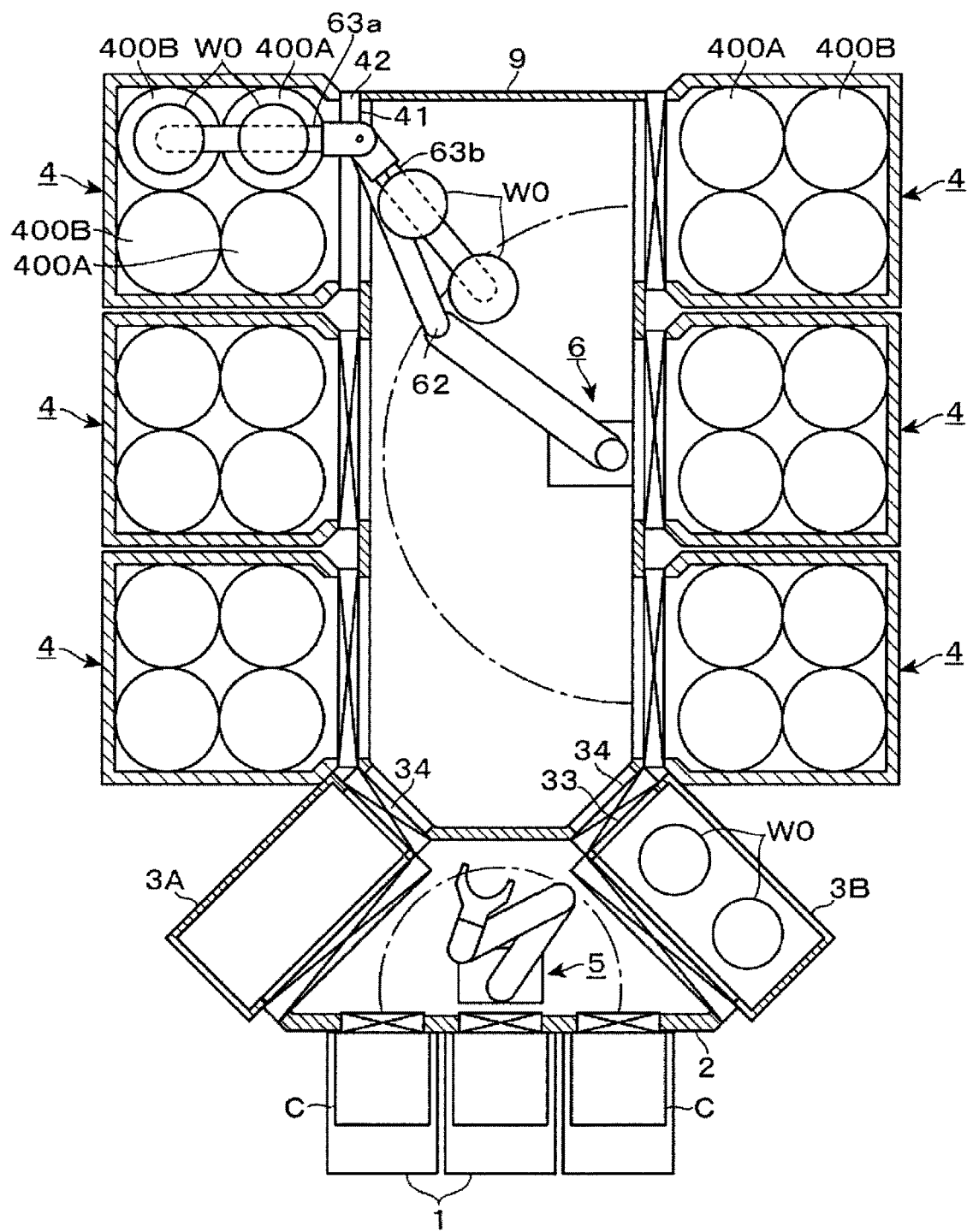
FIGS. 13 to 15 show diagrams explaining the operations of the embodiment of the present invention.

When the vacuum transfer arm 6 holding four unprocessed wafers W including two unprocessed wafers W0 on the first wafer holder 63a and two unprocessed wafers W0 on the second wafer holder 63b is retreated to the vacuum transfer chamber 9, the four unprocessed wafers W0 are transferred to the vacuum processing module 4 on the left-rear side when viewed from the loading/unloading port 1, as shown in FIG. 13. Then, the two wafers W held on the first wafer holder 63a are positioned above the vacuum processing units 400A and 400B arranged on the right side when viewed from the loading/unloading port 41 of the vacuum processing module 4.

At this time, as shown in FIG. 13, the unprocessed wafer W0 held on the base end of the first wafer holder 63a is positioned above the vacuum processing unit 400A on the right-front side when viewed from the loading/unloading port 41, and the unprocessed wafer W0 held on the tip end of the first wafer holder 63a is positioned above the vacuum processing portion 400B on the right-rear side when viewed from the loading/unloading port 41. The lift pins 46 in each of the vacuum processing units 400A and 400B arranged on the right side are lifted to receive the unprocessed wafers W0 held on the first wafer holder 63a and mount them on the vacuum processing units 400A and 400B.

Figure 14:
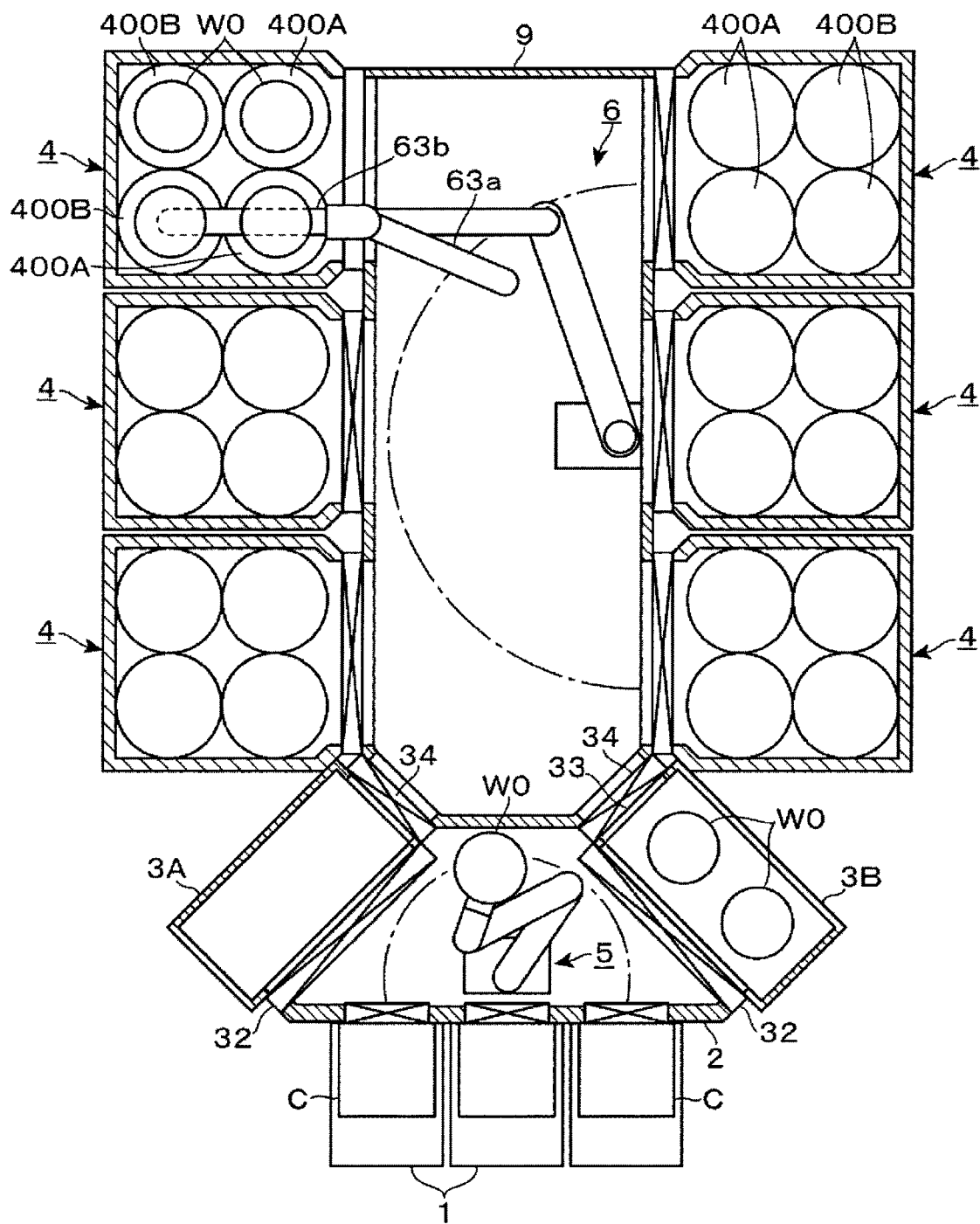

Further, as shown in FIG. 14, the two unprocessed wafers W0 held on the second wafer holder 63b are positioned above the vacuum processing units 400A and 400B arranged on the left side when viewed from the loading/unloading port 41 of the vacuum processing module 4 on the left-rear side when viewed from the loading/unloading port 1. Further, the lift pins 46 in each of the vacuum processing units 400A and 400B arranged on the left side are lifted to receive the unprocessed wafers W0 held on the second wafer holder 63b and mount them on the vacuum processing units 400A and 400B. Then, the vacuum transfer arm 6 is retreated into the vacuum transfer chamber 9, and the gate valve 42 is closed.

Next, the vacuum transfer arm 6 lifts the four unprocessed wafers W0 mounted on the upper wafer mounting shelves 301A and 301B of the load-lock chamber 3B on the right side when viewed from the loading/unloading port 1, transfer them to the vacuum processing module 4 on the right-rear side when viewed from the loading/unloading port 1, and mount them on the vacuum processing units 400A and 400B. Thereafter, the vacuum transfer arm 6 is retreated into the vacuum transfer chamber 9, and the gate valve 42 is closed.

In the right load-lock chamber 3B, as in the left load-lock chamber 3A, after the unprocessed wafers W0 are unloaded, two unprocessed wafers W0 sequentially taken out from the carrier C by the normal pressure transfer arm 5 are mounted on each of the upper wafer mounting shelves 301A and 301B and the atmosphere in the load-lock chamber 3B is maintained in a vacuum atmosphere.

Then, the vacuum transfer arm 6 unloads the unprocessed wafers W0 mounted in the left load-lock chamber 3A from the left load-lock chamber 3A and transfers them to a subsequent vacuum processing module 4, i.e., the vacuum processing module 4 on the middle-left side when viewed from the loading/unloading port 1. Then, the normal pressure transfer arm 5 sequentially loads new unprocessed wafers W0 into the load-lock chamber 3A.

By repeating these processes, four unprocessed wafers W0 are transferred to each of the vacuum processing modules 4 arranged at the front side, the middle side, and the rear side in the front-rear direction at both sides of the vacuum transfer chamber 9. Thereafter, the wafers W are processed in each of the vacuum processing modules 4 as described above.

At this time, in each of the load-lock chambers 3A and 3B, after the unprocessed wafers W0 are taken out by the vacuum transfer arm 6, the normal pressure transfer arm 5 mounts two new unprocessed wafers W0 on each of the upper wafer mounting shelves 301A and 301B and the atmosphere in the load-lock chambers 3A and 3B is switched to a vacuum atmosphere.

Figure 15:
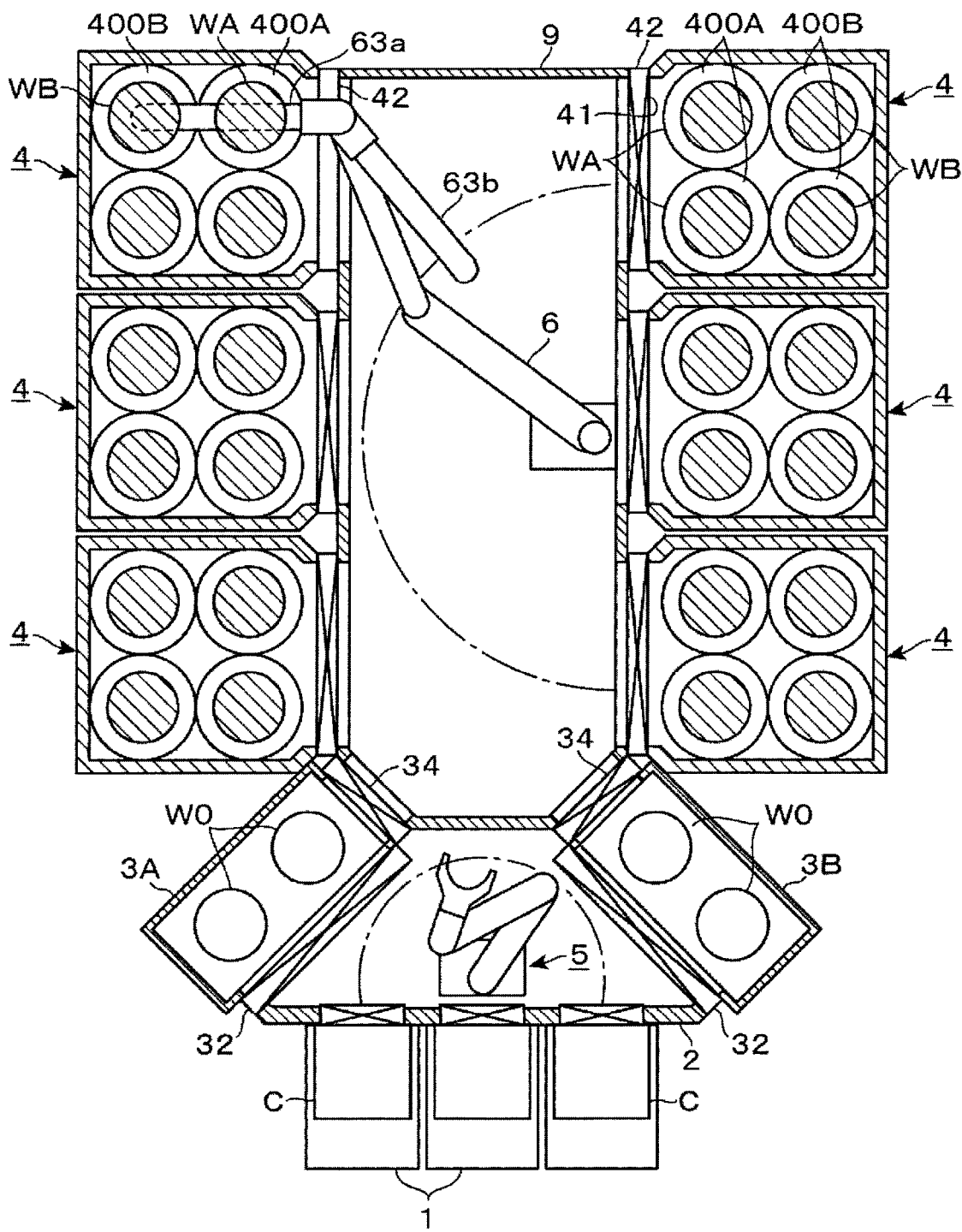

Next, when the processing of the wafers W is completed in each of the vacuum processing modules 4, the gate valve 42 of the vacuum processing module 4 on the left-rear side when viewed from the loading/unloading port 1 is opened, and the processed wafers WA and WB respectively mounted on the two vacuum processing units 400A and 400B on the right side when viewed from the loading/unloading port 41 are lifted by the lifting pins 46. Then, as shown in FIG. 15, the first wafer holder 63a enters the vacuum processing module 4, and the processed wafer WA processed in the vacuum processing unit 400A on the front side is transferred to the base end of the first wafer holder 63a, and the processed wafer WB processed in the vacuum processing unit 400B on the rear side is transferred to the tip end of the first wafer holder 63a by the cooperative operation of the lifting pins 46 in each of the vacuum processing units 400A and 400B and the vacuum transfer arm 6.

Further, the first wafer holder 63a is retreated to the vacuum transfer chamber 9, and the processed wafers WA and WB respectively mounted on the two vacuum processing parts 400A and 400B on the left side are lifted by the lifting pins 46. Then, the processed wafer WA processed in the vacuum processing unit 400A on the front side is transferred to the base end of the second wafer holder 63b, and the processed wafer WB processed in the vacuum processing unit 400B on the rear side is transferred to the tip end of the second wafer holder 63b by the cooperative operation of the lifting pins 46 in each of the vacuum processing units 400A and 400B and the vacuum transfer arm 6.

After the four processed wafers WA and WB are taken out from the vacuum processing module 4 by the vacuum transfer arm 6, the gate valve 34 of the load-lock chamber 3A on the left side when viewed from the loading/unloading port 1 that faces the vacuum transfer chamber 9 is opened. Then, the first wafer holder 63a and the second wafer holder 63b, each holding two processed wafers WA and WB, are aligned to overlap with each other when viewed from above, and the heights of the first wafer holder 63a and the second wafer holder 63b are aligned to correspond to the heights of the lower wafer mounting shelves 302A and 302B in the load-lock chamber 3A. Next, the first wafer holder 63a and the second wafer holder 63b enter the load-lock chamber 3A while overlapping with each other.

Figure 16:
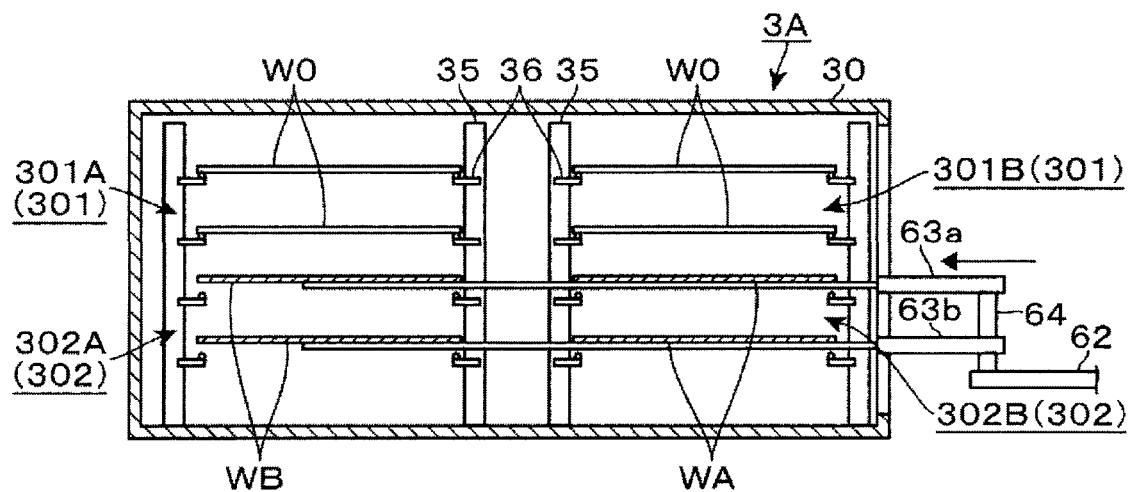
FIGS. 16 to 19 show diagrams explaining a wafer transfer in the load-lock chamber.

Next, as shown in FIG. 16, the processed wafer WB held on the tip end of the first wafer holder 63a is moved to a position corresponding to the upper shelf of the lower wafer mounting shelf 302A on the rear side, and the processed wafer WA held on the base end of the first wafer holder 63a is moved to a position corresponding to the upper shelf of the lower wafer mounting shelf 302B on the front side.

Further, the processed wafer WB held on the tip end of the second wafer holder 63b is moved to a position corresponding to the lower shelf of the lower wafer mounting shelf 302A on the rear side, and the processed wafer WA held on the base end of the second wafer holder 63b is moved to a position corresponding to the lower shelf of the lower wafer mounting shelf 302B on the front side.

Figure 17:
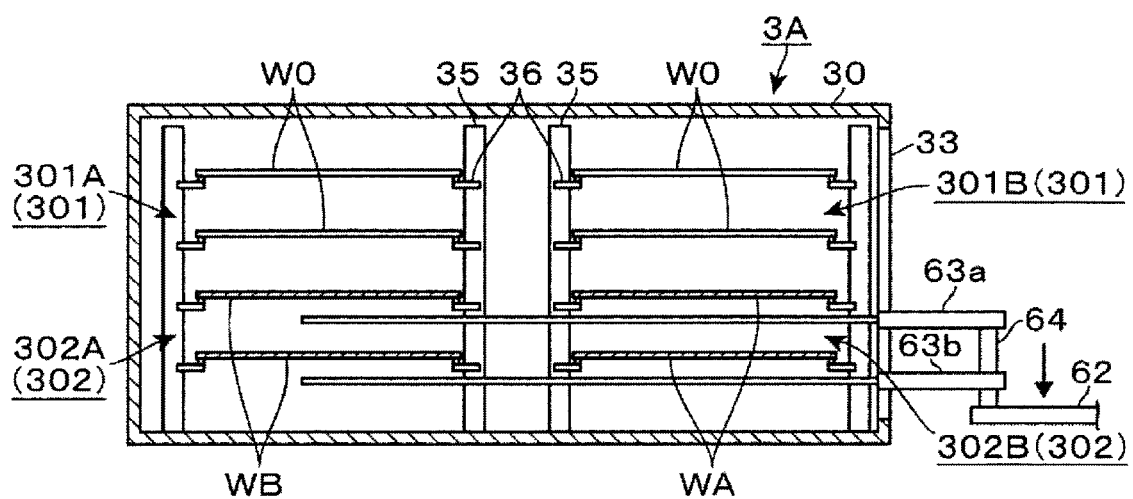

Next, as shown in FIG. 17, the first wafer holder 63a and the second wafer holder 63b are lowered. Accordingly, the processed wafers WB held on the tip ends of the first wafer holder 63a and the second wafer holder 63b are respectively transferred to the upper shelf and the lower shelf of the lower wafer mounting shelf 302A on the rear side. Similarly, the processed wafers WA held on the base ends of the first wafer holder 63a and the second wafer holder 63b are respectively transferred to the upper shelf and the lower shelf of the lower wafer mounting shelf 302B on the front side. Therefore, the vacuum transfer arm 6 transfers the four processed wafers WA and WB into the load-lock chamber 3A and mounts them simultaneously on the lower wafer mounting shelves 302A and 302B.

Figure 18:
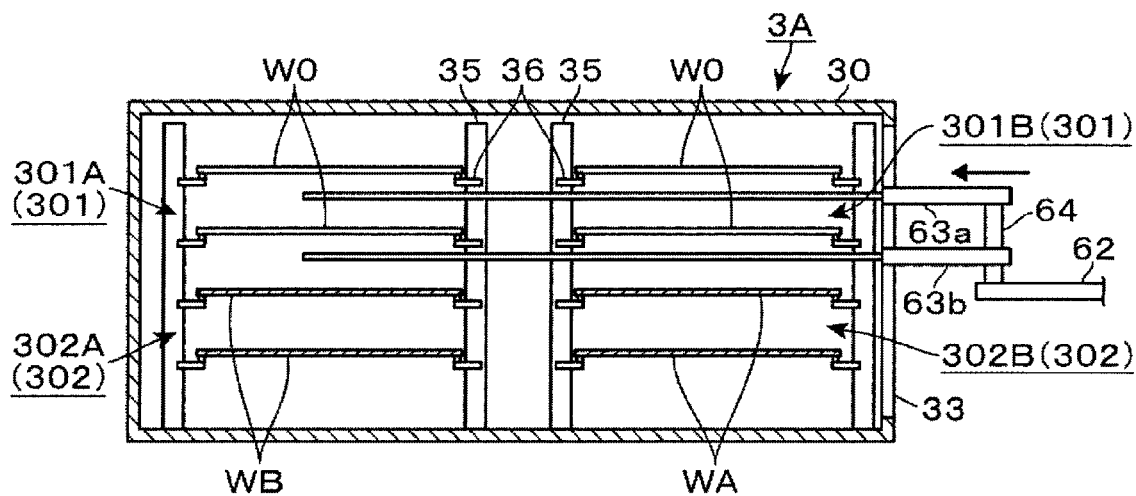
Figure 19:
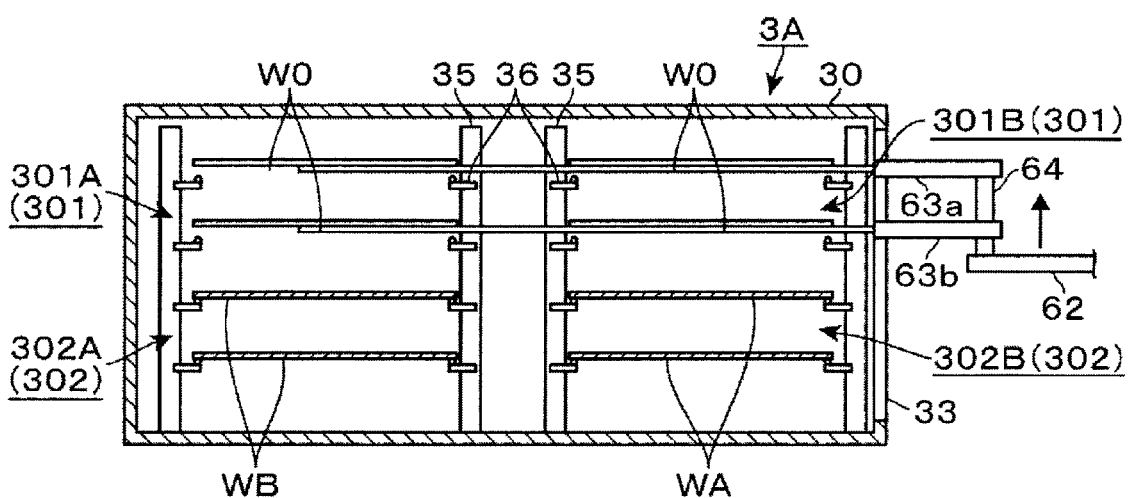

Then, as shown in FIGS. 18 and 19, the vacuum transfer arm 6 lifts and receives two new unprocessed wafers W0 held on each of the upper wafer mounting shelves 301A and 301B using the first wafer holder 63a and the second wafer holder 63b, as previously described in the case of receiving the unprocessed wafers W0 using the vacuum transfer arm 6.

Figure 20:
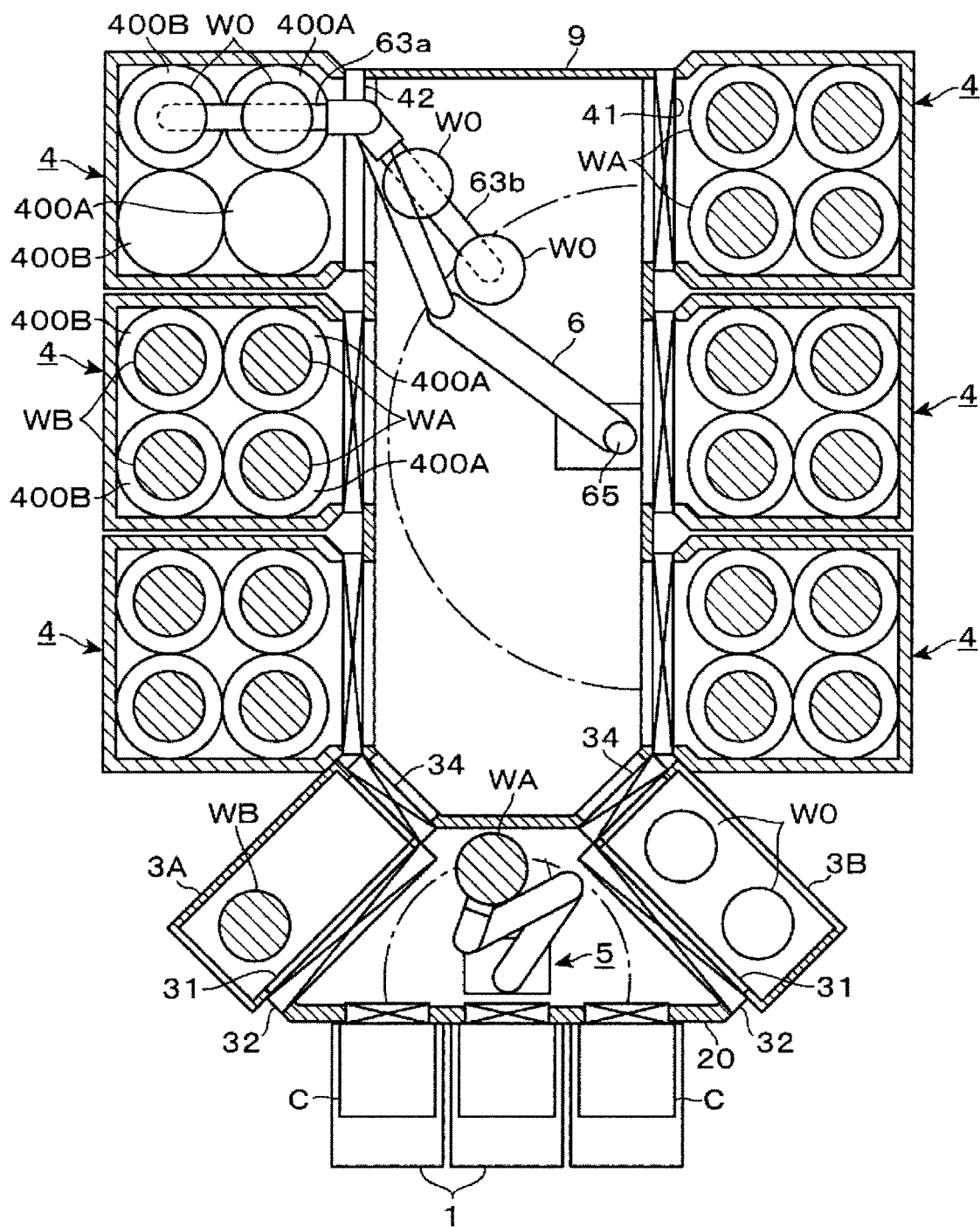
FIG. 20 shows a diagram explaining the operation of the embodiment of the present invention.

Thereafter, as shown in FIG. 20, the vacuum transfer arm 6 transfers the received unprocessed wafers W0 to the vacuum processing module 4 from which the processed wafers WA and WB have been unloaded, the vacuum processing module 4 being on the left-rear side when viewed from the loading/unloading port 1. Then, the vacuum transfer arm 6 transfers the received unprocessed wafers W0 to the vacuum processing units 400A and 400B.

In the load-lock chamber 3A, the gate valve 34 is closed and the inner atmosphere thereof is switched to the atmospheric atmosphere. Then, the gate valve 32 on the normal pressure transfer chamber 2 side is opened, and the four processed wafers WA and WB held on the lower wafer mounting shelves 302A and 302B are returned to the carrier C by the normal pressure transfer arm 5. Then, new unprocessed wafers W0 are sequentially taken out from the carrier C and transferred to the upper wafer mounting shelves 301A and 301B. Thereafter, the gate valve 32 is closed, and the atmosphere in the load-lock chamber 3A is switched to a vacuum atmosphere.

The vacuum transfer arm 6 receives the processed wafers WA and WB from the vacuum processing module 4 on the right-rear side of the vacuum transfer chamber 9 when viewed from the loading/unloading port 1. Then, the vacuum transfer arm 6 transfers the processed wafers WA and WB to the load-lock chamber 3B on the right side when viewed from the loading/unloading port 1. Further, the vacuum transfer arm 6 transfers the unprocessed wafers W0 mounted in the load-lock chamber 3B on the right side to the vacuum processing module 4 from which the processed wafers WA and WB have been unloaded.

As described above, the vacuum transfer arm 6 transfers the processed wafers WA and WB from each vacuum processing module 4 to the load-lock chambers 3A and 3B, and transfers the unprocessed wafers W0 mounted from the load-lock chambers 3A to 3B to the vacuum processing module 4 from which the processed wafers WB have been unloaded. The normal pressure transfer arm 5 transfers the processed wafers WA and WB from the load-lock chambers 3A and 3B to the carrier C, and transfers the unprocessed wafers W0 from the carrier C to the load-lock chambers 3A and 3B. In the above-described manner, the processed wafers WA and WB are unloaded from the vacuum processing module 4, and the unprocessed wafers W0 are loaded into the vacuum processing module 4 and processed sequentially.

In accordance with the above-described embodiment, in the vacuum processing device, the loading/unloading port 1, the normal pressure transfer chamber 2, and the vacuum transfer chamber 9 are connected in that order in the front-rear direction. When the load-lock chambers 3A and 3B are connected to the normal pressure transfer chamber 2, the position in the front-rear direction of the vacuum processing device in the movement range of the wafer W in the normal pressure transfer chamber 2 and the positions in the front-rear direction of the vacuum processing device of the mounting positions of the wafers W in the load-lock chambers 3A and 3B overlap with each other. Accordingly, the length in the front-rear direction of the vacuum processing device can be shortened.

Further, three vacuum processing modules 4 are connected to each of the left side and the right side of the vacuum transfer chamber 9 while being arranged in the front-rear direction when viewed from the loading/unloading port 1. In each vacuum processing module 4, the vacuum processing units 400A and 400B are arranged in the front-rear direction when viewed from the vacuum transfer chamber 9. In the load-lock chambers 3A and 3B, the wafer mounting shelves 300A and 300B on which the wafer W are held are arranged in the front-rear direction when viewed from the vacuum transfer chamber 9. The vacuum transfer arm 6 disposed in the vacuum transfer chamber 9 is configured to hold the wafer W on each of the base end and the tip end of each of the wafer holders 63a and 63b.

Therefore, two wafers W can be transferred between the load-lock chambers 3A and 3B and the vacuum processing modules 4 at the same time, which makes it possible to improve the throughput of the vacuum processing device.

Further, each of the load-lock chambers 3A and 3B includes the upper wafer mounting shelves 301A and 301B holding the unprocessed wafers W0 and the lower wafer mounting shelves 302A and 302B holding the processed wafers WA and WB. Each of the upper wafer mounting shelves 301A and 301B and each of the lower wafer mounting shelves 302A and 302B has two stages. Further, the vacuum transfer arm 6 has an upper wafer holder and a lower wafer holder, i.e., the first wafer holder 63a and the second wafer holder 63b. Each of the first wafer holder 63a and the second wafer holder 63b is configured to hold two wafers. The vertical interval between the first wafer holder 63a and the second wafer holder 63b is aligned with the vertical interval between the upper wafers W held on the upper wafer mounting shelves 301A and 301B and the lower wafers W held on the lower wafer mounting shelves 302A and 302B.

Accordingly, the first wafer holder 63a and the second wafer holder 63b can enter the load-lock chambers 3A and 3B with their positions aligned with such vertical interval and transfer the four wafers simultaneously between the first and second wafer holders 63a and 63b and the upper wafer mounting shelves 301A and 301B in the load-lock chambers 3A and 3B and between the first and second wafer holders 63a and 63b and the lower wafer mounting shelves 302A and 302B in the load-lock chambers 3A and 3B. Therefore, the throughput of the vacuum processing device can be further improved.

Further, the rotation shaft 65 of the lower arm 61 of the vacuum transfer arm 6 is positioned away from the center of the vacuum transfer chamber 9 in the left-right direction. In the above-described embodiment, the rotation shaft 65 is positioned close to the right side in the vacuum transfer arm 6 when viewed from the loading/unloading port 1.

In the case of extending the arms of the vacuum transfer arm 6 to the front side and the rear side of the vacuum transfer chamber 9, the vacuum transfer arm 6 may be required to rotate in a state at least the arms are folded. When the rotation shaft 65 of the vacuum transfer arm 6 is disposed at the center of the vacuum transfer chamber 9, the swing radius of the vacuum transfer arm 6 is shortened. Therefore, the rotation shaft 65 of the vacuum transfer arm 6 is positioned away from the center of the vacuum transfer chamber 9 to increase the swing radius of the vacuum transfer arm 6 without scaling up the vacuum transfer chamber 9. Accordingly, the length of the vacuum transfer arm 6 can be increased.

Further, the height position of the transfer surface for transferring the wafer W from the carrier C to the normal pressure transfer chamber 2 may be the same as the height positions of the load-lock chambers 3A and 3B. In this case as well, the normal pressure transfer chamber 2 and the load-lock chambers 3A and 3B can be arranged such that the position in the front-rear direction of the vacuum processing device in the movement range of the wafer W in the normal pressure transfer chamber 2 and the positions in the front-rear direction of the vacuum processing device of the mounting positions of the wafers W in the load-lock chambers 3A and 3B can overlap with each other. Accordingly, the length in the front-rear direction of the vacuum processing device can be shortened, which is desirable.

In the above-described embodiment, the height position of the transfer surface for transferring the wafer W from the carrier C to the normal pressure transfer chamber 2 is set to be different from the height positions of the load-lock chambers 3A and 3B to avoid interference between the arms of the normal pressure transfer arm 5 and the load-lock chambers 3A and 3 during the rotation of the arms. Therefore, the rotation range of the normal pressure transfer arm 5 is not limited by the positions of the load-lock chambers 3A and 3B. Further, by setting the height position of the transfer surface to be different from the height positions of the load-lock chambers, the load-lock chambers 3A and 3B can be positioned above the rotation range of the normal pressure transfer arm 5 (range indicated by a dashed dotted line in the normal pressure transfer chamber 2 shown in FIG. 1), the installation area of the vacuum processing device can be further reduced.

Further, by setting the height position of the transfer surface for transferring the wafer W from the carrier C to the normal pressure transfer chamber 2 to be different from the height positions of the load-lock chambers 3A and 3B, the area of the normal pressure transfer chamber 2 below the load-lock chambers 3A and 3B can be increased. Therefore, the transfer surface for transferring the wafer W to the normal pressure transfer chamber 2 can be increased, and the movable range of the normal pressure transfer arm 5 can be increased. Accordingly, the number of the loading/unloading ports 1 arranged in the left-right direction can be increased up to, e.g., more than four, which makes it further improve the throughput of the vacuum processing device.

Figure 21:
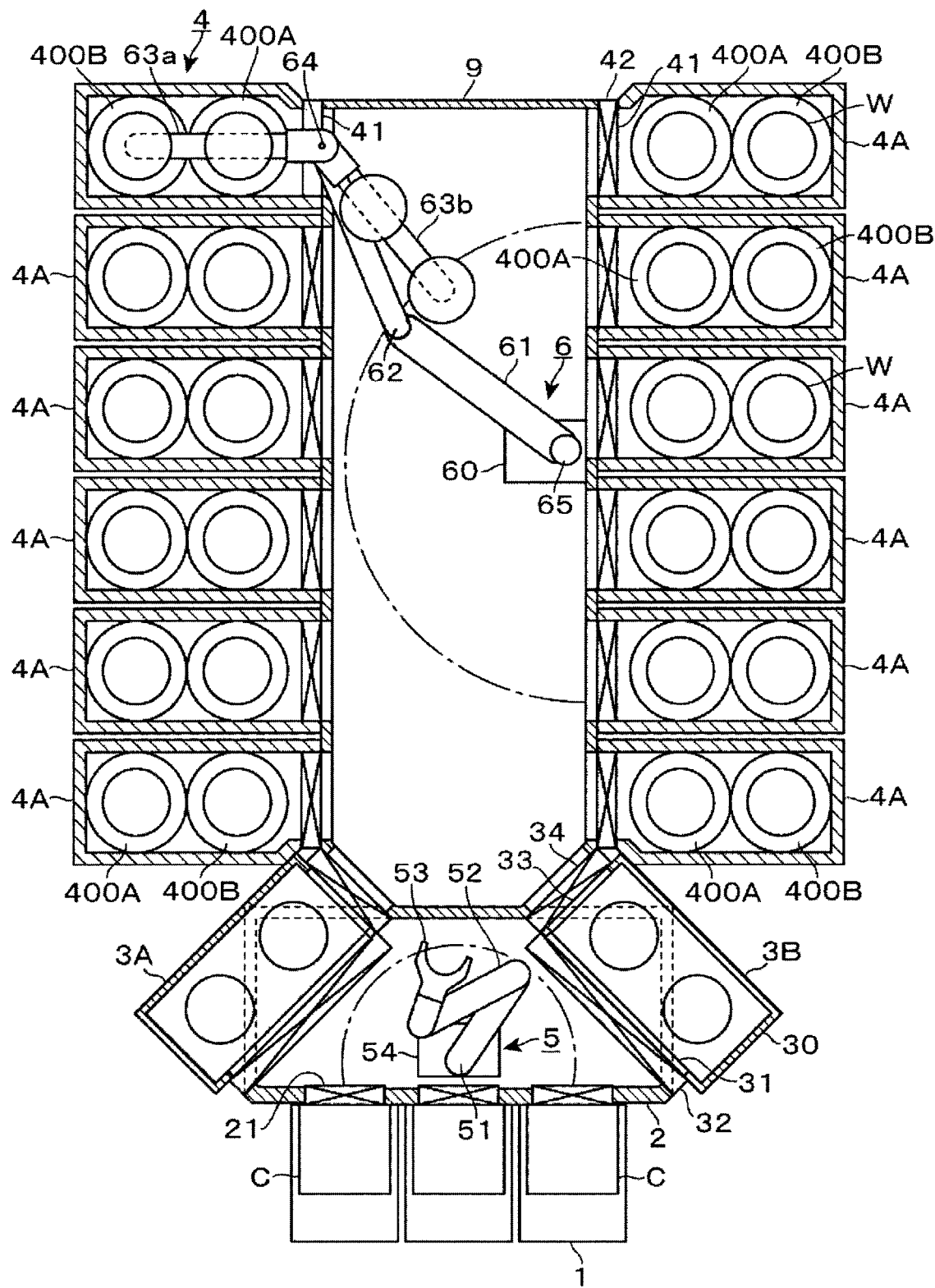
FIG. 21 is a plan view showing a vacuum processing device according to another embodiment of the present invention.

Further, each vacuum processing module 4 may include two vacuum processing units 400A and 400B arranged in the front-rear direction when viewed from the vacuum transfer chamber 9. As shown in FIG. 21, for example, the vacuum processing device has a configuration in which six vacuum processing modules 4A, each including two vacuum processing units 400A and 400B, are arranged in the front-rear direction at each of the left side and the right side of the vacuum transfer chamber 9. Even in this example, two wafers W can be simultaneously transferred from each of the first wafer holder 63a and the second wafer holder 63b of the vacuum transfer arm 6. Therefore, the throughput of the vacuum processing device is improved.

The normal pressure transfer arm 5 and the vacuum transfer arm 6 may be, e.g., transfer mechanisms having wafer holders sliding back and forth and base portions moving in the normal pressure transfer chamber 2 or the vacuum transfer chamber 9.

The vacuum processing module 4 may be, e.g., a film forming device for forming a film on a substrate by supplying a gas, or an etching device for etching a substrate.

The load-lock chambers 3A and 3B may have a configuration in which the mounting tables, each holding one substrate, are disposed in the front-rear direction when viewed from the vacuum transfer chamber 9 and the lifting pins lift the substrates on the mounting tables to transfer them between the mounting tables and the normal pressure transfer arm 5 and between the mounting tables and the vacuum transfer arm 6.

What is claimed is:

1. A vacuum processing device in which a loading/unloading port is provided to load and unload a substrate transfer container, a normal pressure transfer chamber is provided to have therein a normal pressure transfer arm for transferring a substrate to and from the substrate transfer container mounted on the loading/unloading port under a normal pressure atmosphere, and a vacuum transfer chamber in a vacuum atmosphere is provided, and the loading/unloading port, the normal pressure transfer chamber and the vacuum transfer chamber are arranged in that order from a front side toward a rear side, the vacuum processing device comprising:

a vacuum transfer mechanism disposed in the vacuum transfer chamber and having a holder configured to hold a substrate on each of a tip end and a base end thereof;
a plurality of vacuum processing modules airtightly connected to each of a right side and a left side of the vacuum transfer chamber when viewed from the loading/unloading port, wherein a substrate held on the tip end and a substrate held on the base end of the holder are collectively loaded into one of the vacuum processing modules, and vacuum processing is performed on substrates; and
load-lock chambers disposed on the right side and the left side when viewed from the loading/unloading port and having an inner atmosphere switched between a normal pressure atmosphere and a vacuum atmosphere, wherein a substrate held on the tip end and a substrate held on the base end of the holder are collectively loaded into and unloaded from each of the load-lock chambers, and a substrate is loaded into and unloaded from each of the load-lock chambers by the normal pressure transfer arm,
wherein the normal pressure transfer arm has a substrate transfer area enclosed by the normal pressure transfer chamber, and each of the load-lock chambers has a plurality of mounting shelves for mounting at least two substrates, the at least two substrates being positioned side-by-side in the load-lock chambers,
wherein the load-lock chambers are positioned above the normal pressure transfer chamber such that the substrate transfer area overlaps with the plurality of mounting shelves when viewed from a top of the vacuum processing device,
wherein each of the load-lock chambers is arranged such that a line connecting centers of two substrates mounted side-by-side in the load-lock chamber intersects with a central axis extending from the front side to the rear side of the vacuum processing device.

2. The vacuum processing device of claim 1, wherein the load-lock chambers are positioned above a transfer surface where a substrate is transferred with respect to the substrate transfer container by the normal pressure transfer arm.

3. The vacuum processing device of claim 1, wherein each of the load-lock chambers has therein mounting shelves to which a substrate held on the tip end and a substrate held on the base end of the holder are simultaneously transferred and mounted when the holder of the vacuum transfer mechanism is lowered and to which a substrate held on the normal pressure transfer arm is transferred and mounted when the normal pressure transfer arm is lowered.

4. The vacuum processing device of claim 3, wherein the holder of the vacuum transfer mechanism includes an upper holder and a lower holder, and
each of the mounting shelves in each of the load-lock chambers has two stages corresponding to the upper holder and the lower holder.

5. The vacuum processing device of claim 3, wherein each of the vacuum processing modules is configured such that substrates mounted on an upper holder of the holder of the vacuum transfer mechanism and substrates mounted on a lower holder of the holder of the vacuum transfer mechanism are mounted in each of the vacuum processing modules in the direction along the central axis.

6. The vacuum processing device of claim 3, wherein the mounting shelves in each of the load-lock chambers have first mounting shelves for mounting thereon substrates that have not been subjected to vacuum processing and second mounting shelves for mounting thereon substrates that have been subjected to the vacuum processing, and the second mounting shelves are disposed at height positions different from height positions of the first mounting shelves.

7. The vacuum processing device of claim 1, wherein the vacuum transfer mechanism is an articulated arm formed by combining at least three arms, and a rotation center of a base-end arm among the at least three arms is positioned away from a center in a left-right direction of the vacuum transfer chamber.

* * * * *